US008859889B2

(12) United States Patent
Umeda

(10) Patent No.: US 8,859,889 B2
(45) Date of Patent: Oct. 14, 2014

(54) SOLAR CELL ELEMENTS AND SOLAR CELL MODULE USING SAME

(75) Inventor: Koutarou Umeda, Amagasaki (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 13/642,488

(22) PCT Filed: Apr. 20, 2011

(86) PCT No.: PCT/JP2011/059730
§ 371 (c)(1),
(2), (4) Date: Dec. 28, 2012

(87) PCT Pub. No.: WO2011/132707
PCT Pub. Date: Oct. 27, 2011

(65) Prior Publication Data
US 2013/0133737 A1 May 30, 2013

(30) Foreign Application Priority Data
Apr. 20, 2010 (JP) .................................. 2010-096591

(51) Int. Cl.
*H01L 31/0224* (2006.01)
*H01L 31/05* (2014.01)

(52) U.S. Cl.
CPC .. *H01L 31/022458* (2013.01); *H01L 31/02245* (2013.01); *H01L 31/022433* (2013.01); *Y02E 10/50* (2013.01); *H01L 31/0504* (2013.01); *H01L 31/0516* (2013.01)
USPC ........... 136/256; 136/255; 136/261; 136/252; 438/98; 438/72; 438/69; 438/57; 438/94; 257/437; 257/184; 257/53; 257/200; 257/431; 257/432; 257/436

(58) Field of Classification Search
USPC ........ 136/256, 252, 255, 261; 438/98, 72, 69, 438/57, 94; 257/437, 184, 53, 200, 431, 257/432, 436
See application file for complete search history.

(56) References Cited

U.S. PATENT DOCUMENTS 3,903,427 A * 9/1975 Pack .......................... 250/208.2
4,838,952 A * 6/1989 Dill et al. ...................... 136/256
(Continued)

FOREIGN PATENT DOCUMENTS

DE   3714920 C1   7/1988
JP   H06-236880 A   8/1994
(Continued)

OTHER PUBLICATIONS

International Search Report dated Jul. 5, 2011, issued for International Application No. PCT/JP2011/059730.

*Primary Examiner* — Golam Mowla
(74) *Attorney, Agent, or Firm* — Procopio, Cory, Hargreaves & Savitch LLP

(57) ABSTRACT

A solar cell element is disclosed. The solar cell element comprises a semiconductor substrate, a first electrode, a second electrode, a first wiring member and a second wiring member. The semiconductor substrate with a first surface and a second surface comprises a plurality of through-holes. The first electrode comprises a plurality of conduction portions and at least one first output extracting portion. The second electrode has a resistivity of less than 2.5×10-8 Ωm (ohmmeter). The first wiring member comprises a first end face in a long direction thereof. The second wiring member comprises a second end face in a long direction thereof facing the first end face.

15 Claims, 16 Drawing Sheets

(56) References Cited

U.S. PATENT DOCUMENTS

| | | | |
|---|---|---|---|
| 5,178,685 A * | 1/1993 | Borenstein et al. | 136/244 |
| 5,928,438 A | 7/1999 | Salami et al. | |
| 6,265,652 B1 | 7/2001 | Kurata et al. | |
| 2004/0200520 A1 | 10/2004 | Mulligan et al. | |
| 2009/0050190 A1 * | 2/2009 | Nishida et al. | 136/244 |
| 2009/0056804 A1 * | 3/2009 | Hishida | 136/256 |
| 2009/0084437 A1 * | 4/2009 | Nishida et al. | 136/256 |
| 2009/0126788 A1 * | 5/2009 | Hishida et al. | 136/256 |
| 2009/0139570 A1 * | 6/2009 | Kinoshita | 136/256 |
| 2009/0183759 A1 * | 7/2009 | Hishida | 136/244 |
| 2009/0914150 | 8/2009 | Aoki | |
| 2009/0272419 A1 | 11/2009 | Sakamoto et al. | |
| 2009/0314346 A1 * | 12/2009 | Hishida | 136/258 |

FOREIGN PATENT DOCUMENTS

| | | |
|---|---|---|
| JP | H09-008337 A | 1/1997 |
| JP | 2006-245502 A | 9/2006 |
| JP | 2007-201304 A | 8/2007 |
| WO | 97/13280 A1 | 4/1997 |
| WO | 2004/095587 A2 | 11/2004 |
| WO | 2008/015900 A1 | 2/2008 |
| WO | 2008/078471 A1 | 7/2008 |

* cited by examiner (a)

(b)

SOLAR CELL ELEMENTS AND SOLAR CELL MODULE USING SAME

TECHNICAL FIELD

The present invention relates to a solar cell element and to a solar cell module employing same.

BACKGROUND ART

One type of solar cell element is, for example, a back-contact-type solar cell element as indicated at International Patent Application Publication No. 2008/078741. A back-contact-type solar cell element has a first electrode and a second electrode at a backside thereof, a solar cell module being constituted by using a wiring member to electrically connect the first electrode of one solar cell element to the second electrode of another solar cell element.

SUMMARY OF INVENTION

Problems to be Solved by Invention

However, solar cell modules comprising conventional back-contact-type solar cell elements may exhibit a large degree of warping due to differences in coefficients of thermal expansion at solar cell elements and at wiring members, which can cause handling to be difficult during solar cell module formation operations, and which may cause occurrence of cracking or the like during operations.

On the other hand, reducing the amount of wiring member material may result in lowering of output characteristics.

The present invention was conceived to solve the foregoing problems, it being objects thereof to reduce the degree of warping exhibited by a solar cell element and to provide a solar cell module having reduced lowering of output characteristics.

Means for Solving Problem

A solar cell element according to the present invention comprises a semiconductor substrate. The semiconductor substrate comprises a first surface. The semiconductor substrate comprises a second surface at a back side of the first surface. The semiconductor substrate comprises a plurality of through-holes. The through-holes form a line. The through-holes penetrate from the first surface to the second surface. The solar cell element in the present invention further comprises a first electrode. The first electrode comprises a plurality of conduction portions. The conduction portions are respectively located in the plurality of through-holes. The first electrode comprises at least one first output extracting portion. The first output extracting portion is located on the second surface. The first output extracting portion is electrically connected to the conduction portions. The solar cell element in the present invention further comprises a second electrode. The second electrode on the second surface is spaced apart from the first output extracting portion. The second electrode has a resistivity of less than $2.5 \times 10^{-8}$ $\Omega$m (ohm-meter). The solar cell element in the present invention further comprises a first wiring member. The first wiring member has an elongated shape and a first end face in a long direction thereof. The first wiring member is connected to the first output extracting portion. The solar cell element in the present invention further comprises a second wiring member. The second wiring member is connected to the second electrode. The second wiring member comprises a second end face in a long direction thereof facing the first end face.

Benefit of the Invention

In accordance with the present invention, by specifying the wiring configuration and the sheet resistance of electrode(s) at the backside, it is possible to reduce the degree of warping at solar cell element(s) caused by wiring member(s) while maintaining solar cell module output characteristics.

EMBODIMENTS FOR CARRYING OUT THE INVENTION

Below, embodiments of the present invention are described in detail with reference to the drawings.

Solar Cell Element

Figure 1:
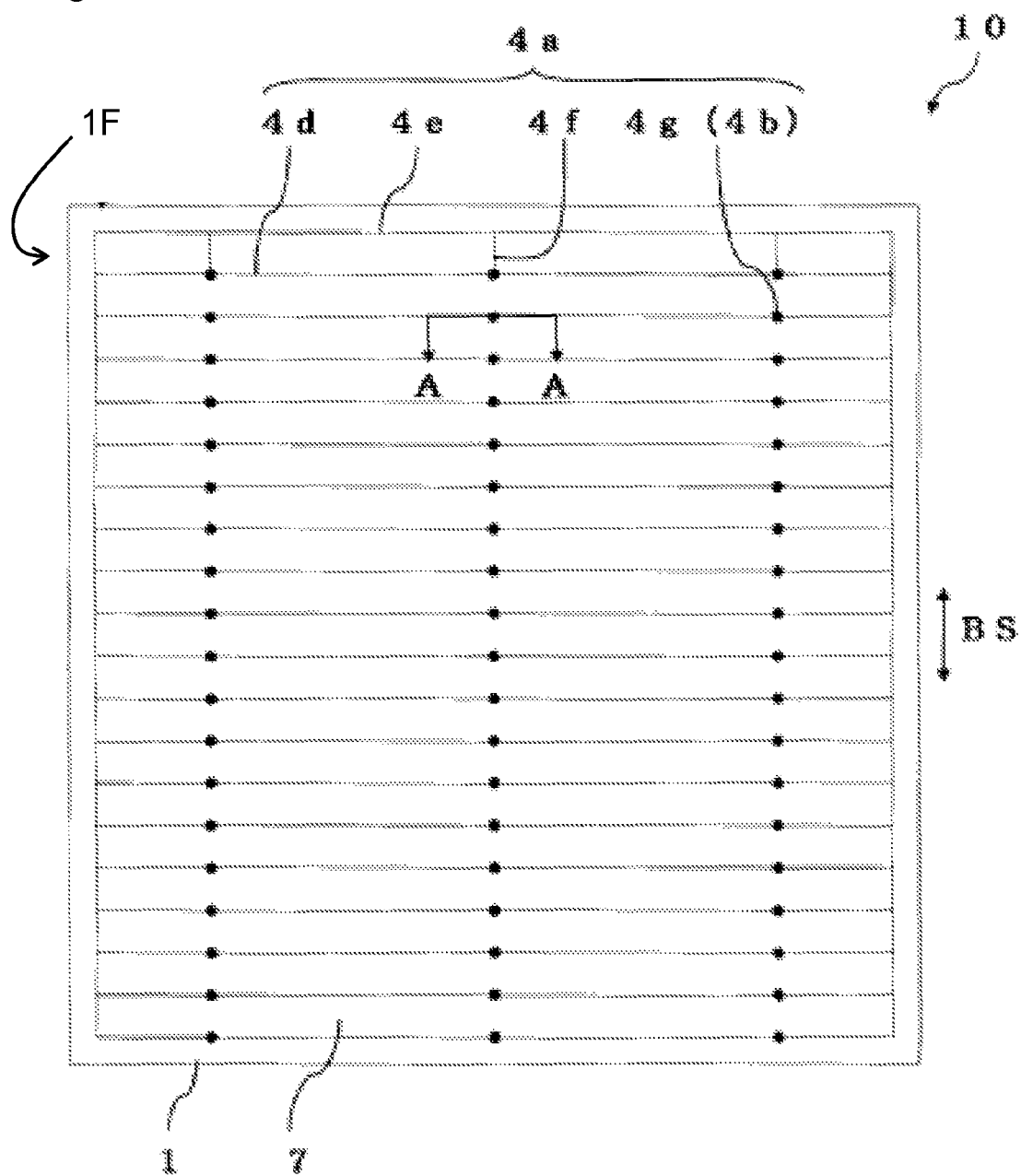
FIG. 1 is a plan view showing a solar cell element according to an embodiment of the present invention as viewed from a first surface side thereof.
Figure 2:
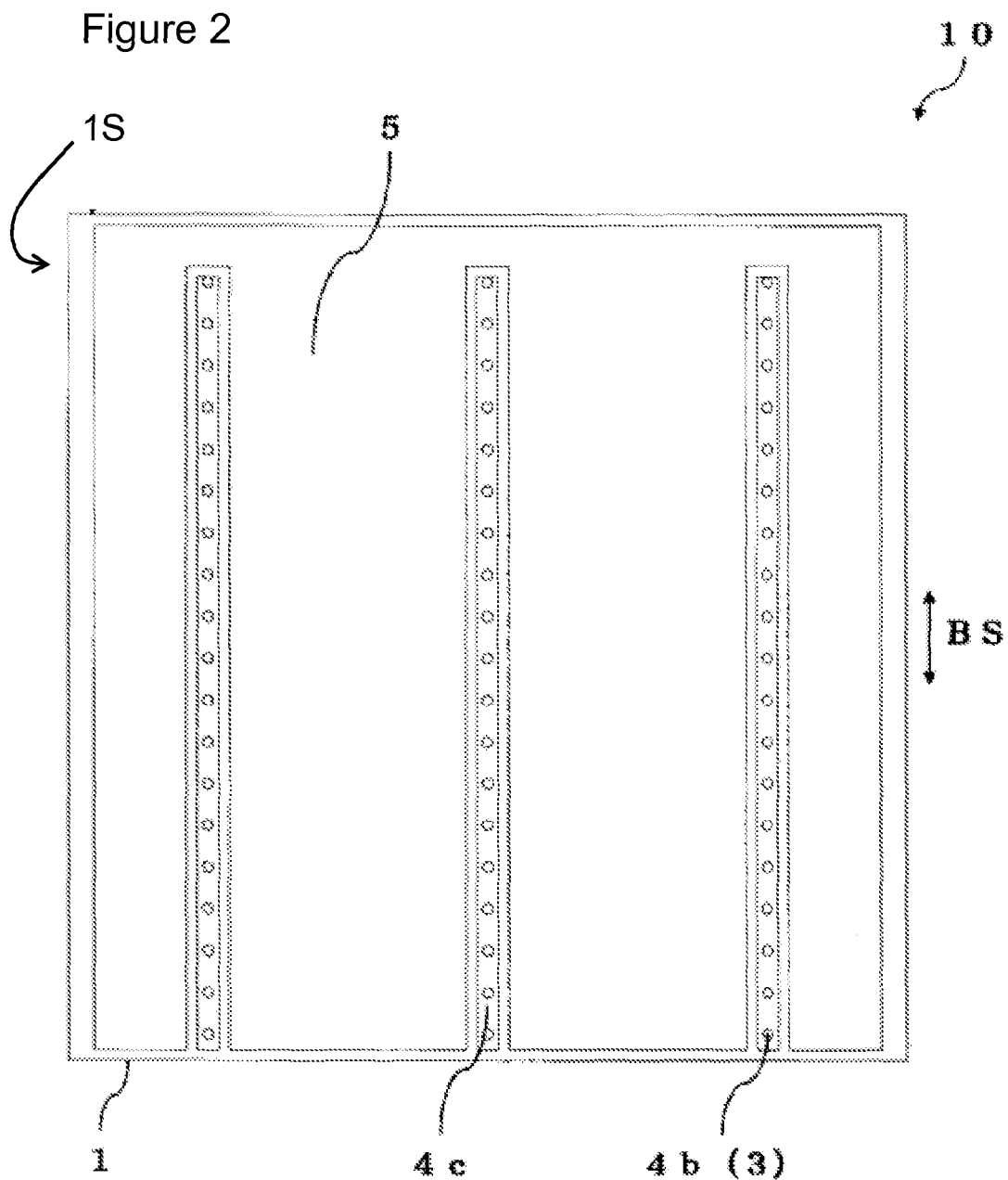
FIG. 2 is a plan view showing a solar cell element according to an embodiment of the present invention as viewed from a second surface side thereof.
Figure 3:
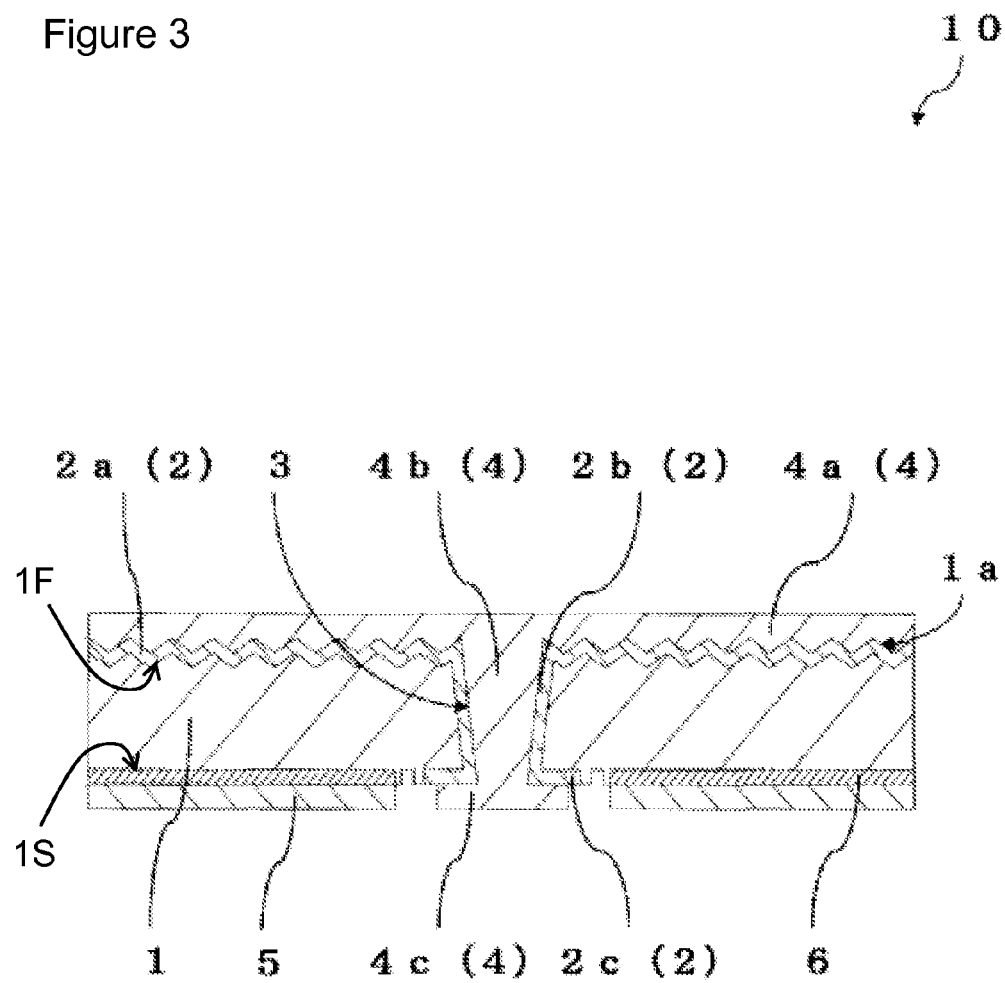
FIG. 3 is one exemplary cross-sectional view of section A-A in FIG. 1.

As shown in FIG. 1 through FIG. 3, solar cell element 10 is provided with one-charge-carrier-type semiconductor substrate 1; other-charge-carrier-type layer 2 having charge carriers of different type than semiconductor substrate 1; through-holes 3; first electrode 4; and second electrode 5.

Semiconductor substrate 1 has first surface 1F (the face at the top in FIG. 3), and has second surface 1S (the face at the bottom in FIG. 3) at the back side of first surface 1F. First surface 1F is the front face of solar cell element 10 (below, for convenience of description, first surface 1F may be referred to as the front side of semiconductor substrate 1, second surface 1S may be referred to as the back side of semiconductor substrate 1, and so forth).

As semiconductor substrate 1, monocrystalline silicon substrate, polycrystalline silicon substrate, or other such crystalline silicon substrate having prescribed dopant element(s) (impurities for controlling charge carrier type) and being of one charge carrier type (e.g., p-type) may, for example, be employed. It is, for example, more preferred that thickness of semiconductor substrate 1 be not more than 250 μm (micrometers), and still more preferred that this be not more than 150 μm (micrometers). While there is no particular limitation with respect to the shape of semiconductor substrate 1, a rectangular shape therefor as in the present embodiment is favorable from the standpoint of manufacturability. The present embodiment will be described in terms of an example in which crystalline silicon substrate having p-type charge carriers is employed as semiconductor substrate 1.

When semiconductor substrate 1 is p-type crystalline silicon substrate, boron or gallium may be favorably used as dopant element.

As shown in FIG. 3, textured structure (nonsmooth structure) 1a, comprising a multiplicity of fine projections and being for the purpose of reducing reflection of light incident on first surface 1F and increasing absorption of sunlight within semiconductor substrate 1, is formed on the first surface 1F side of semiconductor substrate 1. Textured structure 1a may be formed as necessary.

As shown in FIG. 3, at semiconductor substrate 1, a plurality of through-holes 3 are formed between first surface 1F and second surface 1S. Conduction portion 4b of first electrode 4 is formed at the interior of through-hole 3. It is preferred that through-holes 3 be formed with constant pitch therebetween and such that the diameters thereof are within a range that is not less than 50 μm (micrometers) and not more than 300 μm (micrometers). "Internal surface of through-hole 3" refers to the surface of the internal wall in the region at which through-hole 3 is formed in semiconductor substrate 1. As described below, through-hole 3 is such that second other-charge-carrier-type layer 2b is formed at the internal surface thereof.

Other-charge-carrier-type layer 2 is a layer having charge carriers of opposite type to semiconductor substrate 1. Other-charge-carrier-type layer 2 comprises first other-charge-carrier-type layer 2a, which is formed on the first surface 1F side of semiconductor substrate 1; second other-charge-carrier-type layer 2b, which is formed at the internal surface of through-hole 3; and third other-charge-carrier-type layer 2c, which is formed on the second surface 1S side of semiconductor substrate 1. When p-type silicon substrate is used as semiconductor substrate 1, other-charge-carrier-type layer 2 will be n-type. Conversely, when n-type silicon substrate is used as semiconductor substrate 1, other-charge-carrier-type layer 2 will be p-type.

First other-charge-carrier-type layer 2a is favorably formed as a layer which is of type n+ and which has sheet resistance on the order of 60Ω/☐ (ohm/square) to 300Ω/☐ (ohm/square). Within this range, it is possible to suppress increase in surface resistance and increase in surface recombination at first surface 1F. It is preferred that first other-charge-carrier-type layer 2a and second other-charge-carrier-type layer 2b be formed at first surface 1F of semiconductor substrate 1 so as to be on the order of 0.2 μm (micrometer) to 2 μm (micrometers) in thickness.

Third other-charge-carrier-type layer 2c is formed at those portions of second surface 1S of semiconductor substrate 1 at which first electrode 4 is formed, and at region(s) peripheral thereto.

Presence of such other-charge-carrier-type layer 2 makes it possible to form a pn junction between other-charge-carrier-type layer 2 and semiconductor substrate 1 at solar cell element 10.

As shown in FIG. 3, solar cell element 10 has semiconductor layer 6 at second surface 1S of semiconductor substrate 1. The purpose of semiconductor layer 6 is to form an internal electric field, i.e., to attain a back surface field (BSF) effect, at the interior of solar cell element 10 so as to suppress reduction in efficiency of electric power generation due to carrier recombination occurring in the vicinity of second surface 1S of semiconductor substrate 1. Semiconductor layer 6 is formed at region(s) on the second surface 1S side of semiconductor substrate 1 where first electrode 4 is not provided (uninterrupted region(s)). More specifically, semiconductor layer 6 is formed at the second surface 1S side in such fashion as to not come in contact with third other-charge-carrier-type layer 2c or first electrode 4.

pn isolation regions are provided between third other-charge-carrier-type layer 2c and semiconductor layer 6, and at regions along the perimeter of second surface 1S of semiconductor substrate 1, semiconductor substrate 1 being exposed at such pn isolation regions.

Semiconductor layer 6 is of the same charge carrier type as semiconductor substrate 1, but has higher concentration of dopant than the concentration of dopant contained in semiconductor substrate 1. What is meant here by "higher concentration" is that dopant element(s) is/are present in higher concentration than the concentration of dopant element(s) with which semiconductor substrate 1 is doped for the purpose of making it one-charge-carrier type.

When semiconductor substrate 1 is p-type, semiconductor layer 6 may be favorably formed by, for example, causing diffusion of boron, aluminum, or other such dopant element(s) at second surface 1S so as to achieve a concentration of such dopant element(s) that is on the order of $1 \times 10^{18}$ to $5 \times 10^{21}$ atoms/cm$^3$. This causes semiconductor layer 6 to have charge carriers of type p+ and to contain dopant at higher concentration than at semiconductor substrate 1, making it possible for semiconductor layer 6 to achieve ohmic contact with second electrode 5, described below.

As shown in FIG. 1, solar cell element 10 has antireflective film 7 at the first surface 1F side of semiconductor substrate 1.

Antireflective film 7, which serves to reduce reflection of light incident on the surface (first surface 1F) of semiconductor substrate 1, is formed over other-charge-carrier-type layer 2a. Antireflective film 7 may be favorably formed from silicon nitride film, or a film which is an oxide of silicon or titanium, or the like. While suitable values for thickness of antireflective film 7 will vary depending on the material from which it is constituted, such values should be set so as to permit achievement of nonreflection of incident light. For example, when silicon substrate is used as semiconductor substrate 1, antireflective film 7 may be formed at a thickness on the order of 500 Angstroms to 1200 Angstroms from material of refractive index on the order of 1.8 to 2.3. Presence of antireflective film 7 is not essential to the constitution of the present embodiment, it being the case that it may be formed as necessary.

As shown in FIG. 3, first electrode 4 has main electrode portion 4a, which is formed on first surface 1F of semiconductor substrate 1; conduction portion 4b, which is provided within through-hole 3 and which is electrically connected to main electrode portion 4a; and first output extracting portion 4c, which is formed on second surface 1S and which is connected to conduction portion 4b. Main electrode portion 4a has the function of collecting carriers produced at first surface 1F. Conduction portion 4b has the function of guiding carriers collected by main electrode portion 4a to first output extracting portion 4c provided at second surface 1S. First output extracting portion 4c has the function of serving as wiring connection portion which is connected to a wiring member that electrically interconnects adjacent solar cell elements.

As shown in FIG. 1, in the present embodiment, a plurality of conduction portions 4b are arrayed in a single prescribed direction, being disposed with generally even spacing therebetween in such fashion as to lie along straight line(s) parallel to the aforesaid direction in which they are arrayed. This direction of arrayal of conduction portions 4b more or less matches the long direction of wiring member 15 which is connected thereto. At FIG. 1, a plurality of sets of conduction portions 4b, each set of which lies along a straight line, are arrayed in parallel.

A plurality of conduction portions 4b are arrayed in directions parallel to reference line BS at first surface 1F of semiconductor substrate 1 so as to form a plurality of columns (three columns at FIG. 1). Reference line BS is the direction in which a plurality of solar cell elements 10 are arrayed when forming a solar cell module 20. More specifically, reference line BS is a line with respect to which long direction(s) of string(s) of solar cells are made parallel when solar cell elements 10 are arranged along straight line(s). Direction(s) parallel to reference line BS (direction(s) parallel with respect to reference line BS) may be referred to below as direction(s) of arrayal BS. It should be understood that the term "parallel" as used in the present specification should not be interpreted in a strictly mathematical or other such sense.

An embodiment of a solar cell module according to the present invention will now be described in detail.

Solar cell module 20 according to the present embodiment may be constituted such that, for example, at least two solar cell elements 10 arranged in adjacent fashion are mutually connected in series by wiring member 15.

Figure 5:
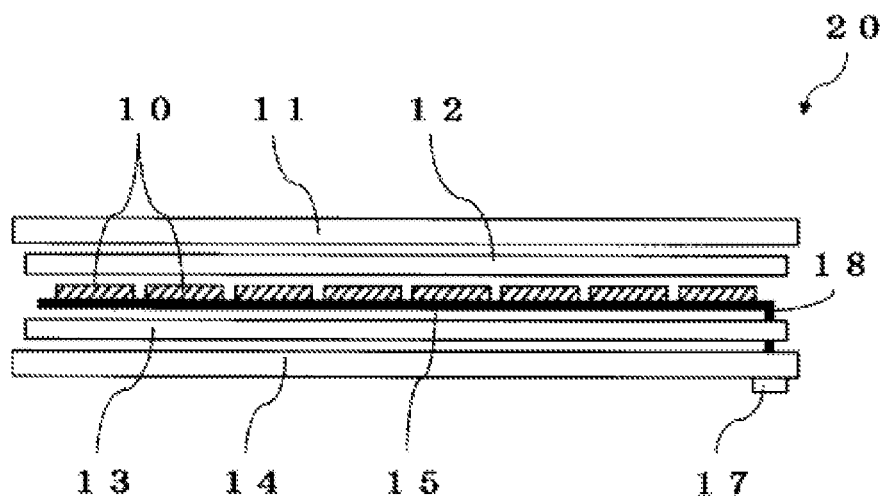
FIG. 5 is a group of drawings showing, in schematic fashion, constitution of a solar cell module according to an embodiment of the present invention, (a) being a cross-sectional view, and (b) being a plan view.
Figure 5:
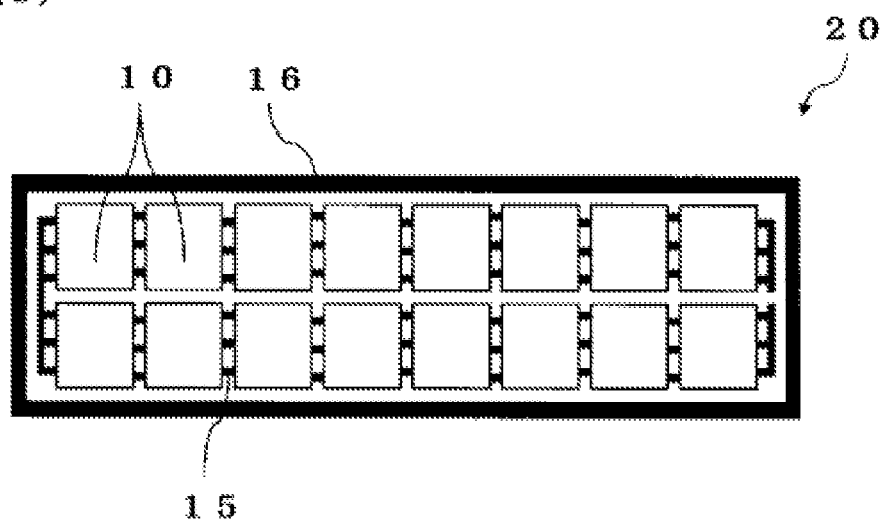

As shown at FIG. 5 (a), solar cell module 20 has as principal components: translucent member 11 comprising glass or the like; frontside filler material 12 comprising transparent ethylene-vinyl acetate copolymer (EVA) or the like; a plurality of solar cell elements 10; backside filler material 13 comprising EVA or the like; and backside protective member 14 which is of single-layer or laminated construction and which comprises polyethylene terephthalate (PET), polyvinyl fluoride resin (PVF), or other such material.

As shown at FIG. 5 (b), plurality of solar cell elements 10 are mutually connected in series by wiring member 15, which functions as member for interconnecting mutually neighboring solar cell elements 10.

Figure 6:
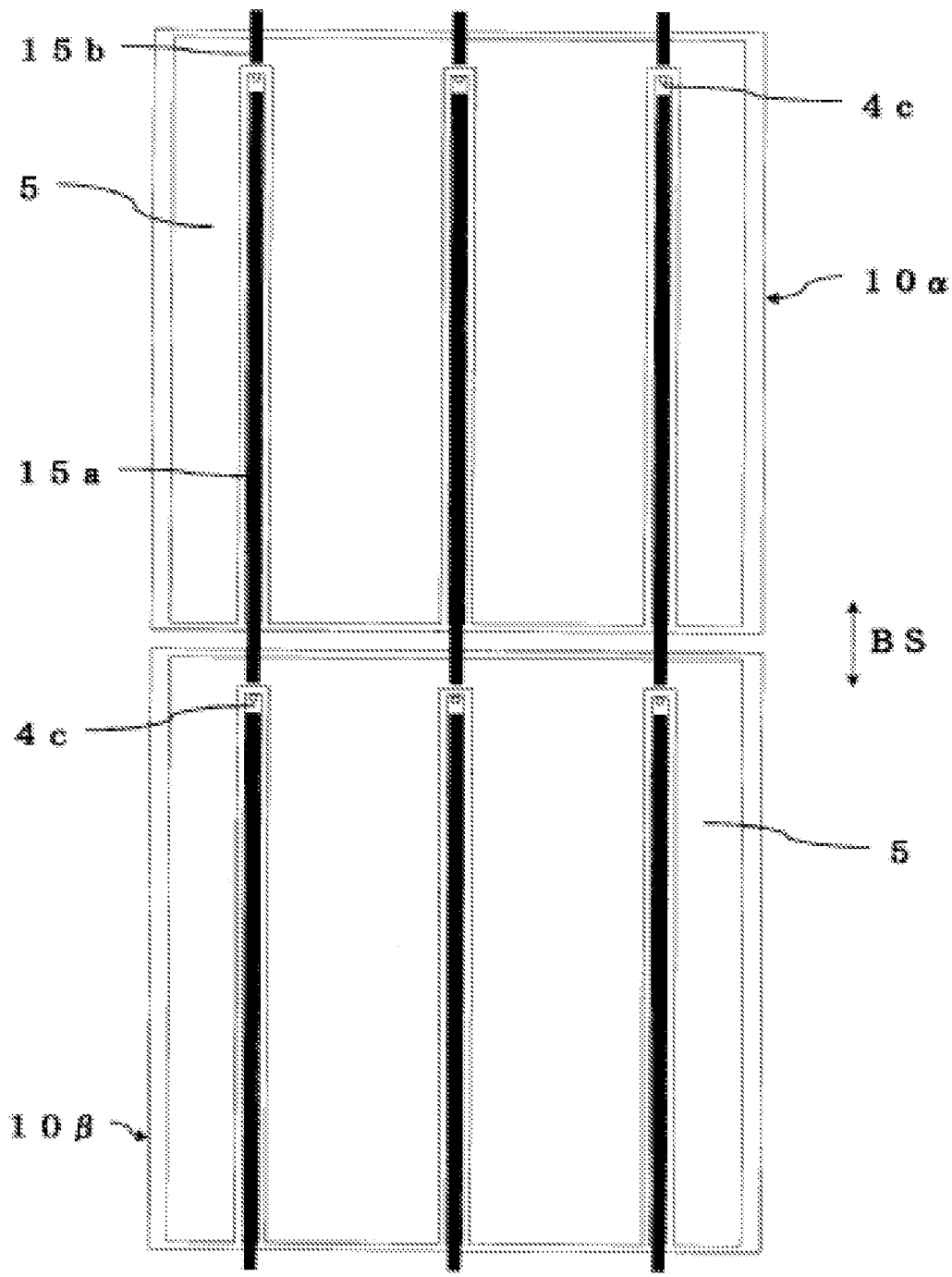
FIG. 6 is a plan view showing a solar cell module according to an embodiment of the present invention.

As shown in FIG. 6, mutually neighboring solar cell elements at FIG. 5 (b) are interconnected by virtue of the fact that long (linear) wiring member 15 at the back side thereof connects first output extracting portion 4c of solar cell element 10α, which is one of a pair of the mutually neighboring solar cell elements, to second electrode 5 of solar cell element 10β, which is the other of the pair of mutually neighboring solar cell elements.

The present embodiment comprises: a semiconductor substrate that comprises a first surface which receives light, and a second surface at a back side of said first surface, and that has formed therein a plurality of through-holes which are arrayed in one direction and which penetrate a space between the first surface and the second surface; a first electrode that comprises a plurality of conduction portions which are respectively provided within the plurality of through-holes, and a first output extracting portion which is provided on the second surface and which is electrically connected to the conduction portions; a second electrode that is provided on the second surface so as to be spaced apart from the first output extracting portion, and that has a resistivity which is not more than $2.5 \times 10^{-8}$ Ωm (ohm-meter); a first wiring member that is connected to the first output extracting portion; and a second wiring member that is connected to the second electrode, and that is arranged such that an end face in a long direction thereof is opposed to an end face in a long direction of the first wiring member.

In the present embodiment, the first wiring member and the second wiring member are arranged so as to lie on a straight line.

That is, as at FIG. 6, first wiring member 15a which is electrically connected to first electrode 4 (first output extracting portion 4c) of a solar cell element 10 and second wiring member 15b which is electrically connected to second electrode 5 are arranged so as to lie on a straight line. As a result, because this permits reduction in the area of the region at which wiring member 15 is connected as compared with the conventional situation in which first wiring member 15a and second wiring member 15b are arrayed in parallel, it is possible to reduce the degree of warping occurring due to differences in coefficients of thermal expansion at solar cell element 10 and at wiring member 15.

Because wiring member 15a makes connection thereto over first output extracting portion 4c, this reduces path lengths taken by current collected by the respective main electrode portions 4a. As a result, there is decreased tendency for occurrence of photovoltaic losses due to internal resistance.

As wiring member 15, it is possible to, for example, employ strip-like copper foil on the order of 0.1 mm to 0.4 mm in thickness and on the order of 1 mm to 3 mm in width which has been coated with solder material and cut to prescribed length. When wiring member 15 is coated with solder material, hot air, a soldering iron, or the like may be used, or a reflow oven or the like may be used, to carry out soldering at first output extracting portion 4c and second electrode 5. Wiring member 15 may, for example, be made up of copper, silver, or other such metal. Electrically conductive adhesive or solder paste comprising electrically conductive paste consisting of low-temperature-curing electrically conductive filler made up of silver, nickel, carbon or the like may be used to connect wiring member 15 to first output extracting portion 4c and second electrode 5. While it is possible to use members having the same dimensions as the wiring members 15 that respectively carry out connection at first output extracting portion 4c and second electrode 5, it is also possible for these to have respectively different dimensions.

White resin or the like may be used as backside protective member 14. If material of high reflectance is used as backside protective member 14, because diffuse reflection by backside protective member 14 of light that irradiates the spaces between solar cell elements 10 will facilitate irradiation of solar cell elements 10, this will cause a greater amount of light to be received by solar cell elements 10.

It is preferred in the present embodiment that the second electrode have a plating layer that contains tin or silver, and that is 5 μm (micrometers) to 30 μm (micrometers) in thickness. A second electrode having a plating layer of such thickness will tend not to warp.

By providing second electrode 5 with a plating layer 52 having low resistance, it is possible to reduce photovoltaic losses associated with current collected at second electrode 5 and cause current to flow to second wiring member 15b. For this reason, it is possible to maintain high output characteristics of the solar cell module even when the area of the region over which wiring member(s) 15 is/are installed is reduced.

Figure 7:
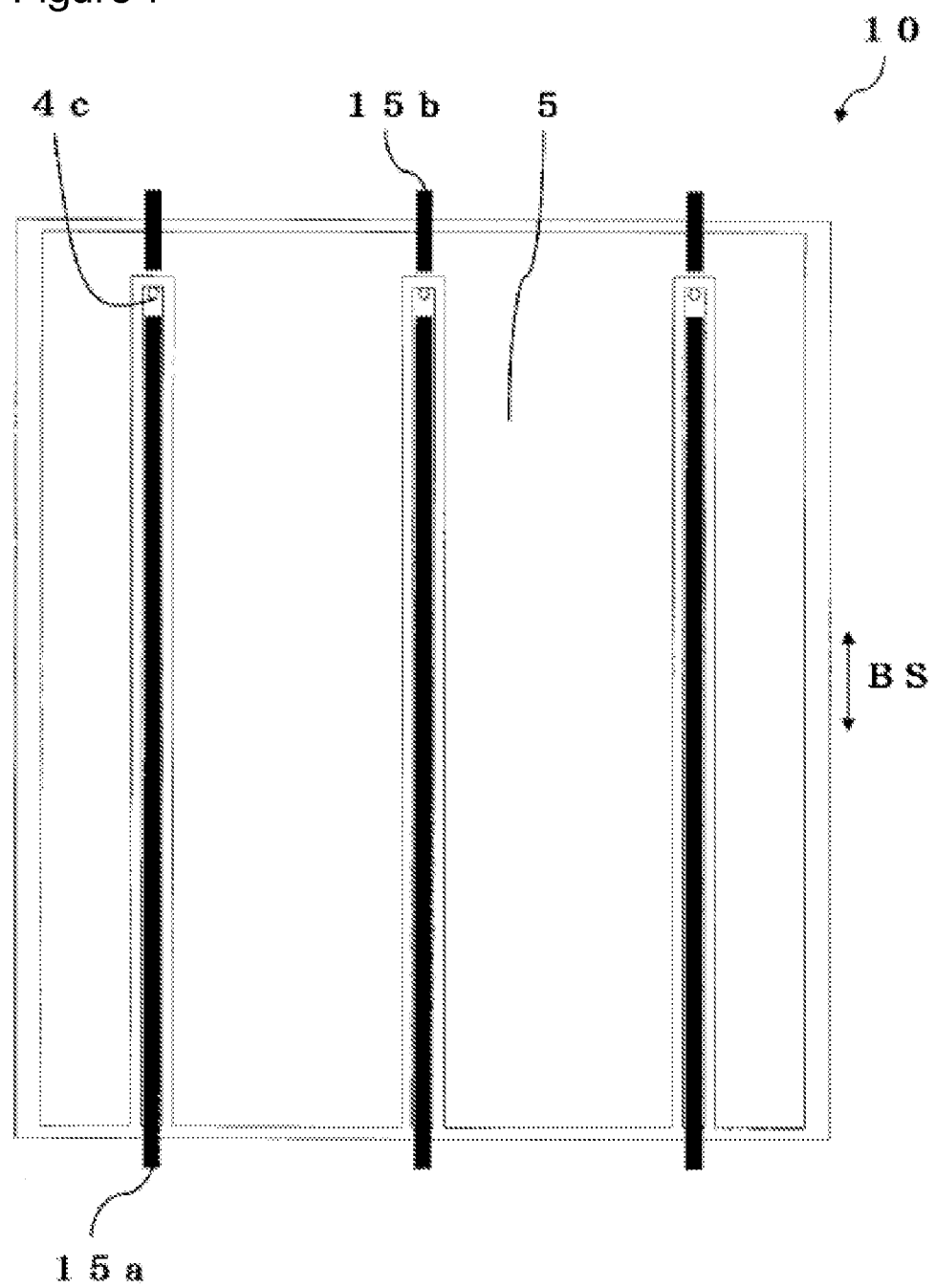
FIG. 7 is a plan view showing solar cell element according to an embodiment of the present invention as viewed from the second surface side thereof.

At FIG. 7, when solar cell element 10 is viewed as projected onto a plane, causing the region over which first wiring member 15a and solar cell element 10 overlap to be not less than 80% of the length of solar cell element 10 in the direction of arrayal BS is preferred due to the fact that there will be decreased tendency for occurrence of photovoltaic losses due to internal resistance.

Figure 16:
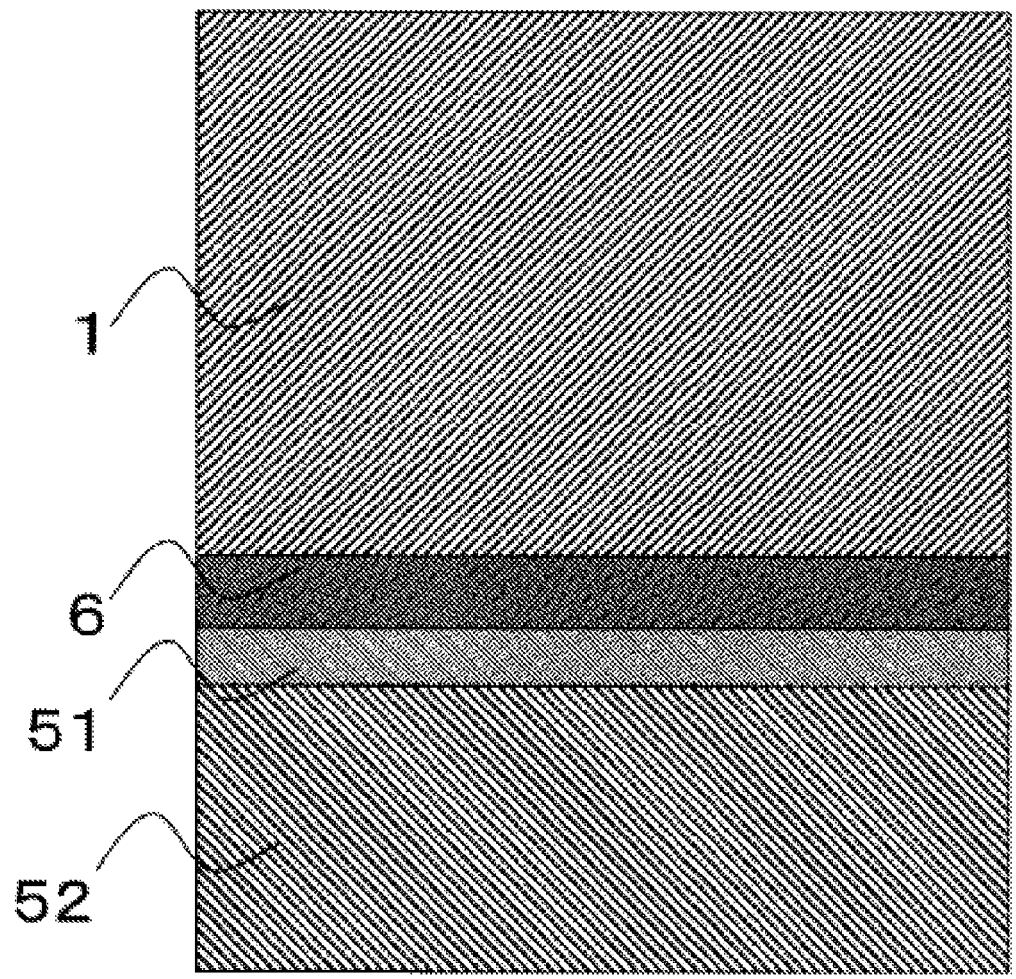
FIG. 16 is a schematic sectional view showing second electrode structure at a solar cell element according to the present invention.

For example as shown in FIG. 16, because the second electrode has plating layer 52, this permits sufficient reduction in resistive losses, as a result of which it is possible to improve output characteristics of the solar cell element. Forming the second electrode 5 with plating layer such that void ratio of the second electrode 5 is not more than 5% will permit reduction in resistivity of second electrode 5. A portion of second electrode 5 is present at a location that is toward an end in the direction of arrayal from first output extracting portion 4c. Width of second electrode 5 in a direction perpendicular to the direction of arrayal at the location where it is present toward the end is 2 mm to 20 mm.

It is preferred in the present embodiment that second electrode 5 further contain an underlayer 51 serving as underlayment beneath the plating layer, and that underlayer 51 contain a titanium-tungsten-type alloy.

At second electrode 5, sputtering or vapor deposition may, for example, be employed to form underlayer 51 from aluminum or silver, or from copper, titanium-tungsten-type alloy, or other such metal, plating layer 52 comprising copper, tin, and silver being formed over underlayer 51. It is also possible to form an aluminum layer below a titanium-tungsten alloy layer.

Plating layer 52 may be constituted from a plurality of layers, it being possible, for example, for a first plating layer comprising copper to be formed over underlayer 51, and for a second plating layer comprising tin or silver to be formed thereover. At such time, first output extracting portion 4c may simultaneously be formed, and there is no objection to a situation in which first output extracting portion 4c is made to consist solely of underlayer 51.

It is preferred that thickness of underlayer 51 be 50 μm (micrometers) to 500 μm (micrometers).

This will make it possible to achieve a situation in which an underlayer 51 that has high resistivity is made to have small thickness, and resistive losses at second electrode 5 are reduced, while adhesion with respect to plating layer 52 is at the same time improved.

Methods for forming plating layer 52 will now be described. For example, semiconductor substrate 1 is immersed in a plating tank containing electrolytic plating solution. An anode comprising metal material is provided at the electrolytic plating solution within the plating tank. Because underlayer 51, which is what is to be plated, will serve as cathode, electricity-supplying member comprising electrically conductive clip(s) or the like is attached to underlayer 51. Application of a voltage between the anode and the cathode by means of a power supply causes electric current to flow, as a result of which plating layer 52 is formed over underlayer 51.

A plating solution containing the metal that makes up plating layer 52 is used as the electrolytic plating solution, and plate(s) made of the metal that makes up plating layer 52 is used as the metal member(s) which serve as anode. The metal member(s) which serve as anode may be insoluble, it being possible to use iridium-oxide-coated titanium, platinum-coated titanium, or the like thereas. For example, when plating layer 52 is copper, copper sulfate plating solution, copper pyrophosphate plating solution, copper cyanide plating solution, or the like may be used as the electrolytic plating solution; and copper plate(s) comprising copper which contains phosphorous may be used as the metal member(s) which serve as anode.

It is preferred in the present embodiment that area of second electrode 5 expressed as a fraction of area of second surface 1S be 89% to 95% thereof.

Within this range, it will be possible to lower resistive losses at both first output extracting portion 4c and second electrode 5, and ensure that there is area available for occupation by first output extracting portion 4c.

It is preferred in the present embodiment that a plurality of first output extracting portions 4c be disposed therein in approximately parallel fashion, and that width of the second electrode which is provided between first output extracting portions 4c be 10 mm to 50 mm. It is more preferred that this be not less than 20 mm and not more than 35 mm.

If width of the second electrode is 10 mm to 50 mm, this will permit efficient collection of carriers produced at the second surface 1S side, and will make it possible to lower resistive losses at second electrode 5 and to improve output characteristics.

While there are three first output extracting portions 4c provided at FIG. 2, the present invention is not limited thereto, it being possible to provide four or five thereof if electrode width in the regions between first output extracting portions 4c is made more narrow.

It is preferred in the present embodiment that a passivation film be present between second electrode 5 and the semiconductor substrate.

Figure 4:
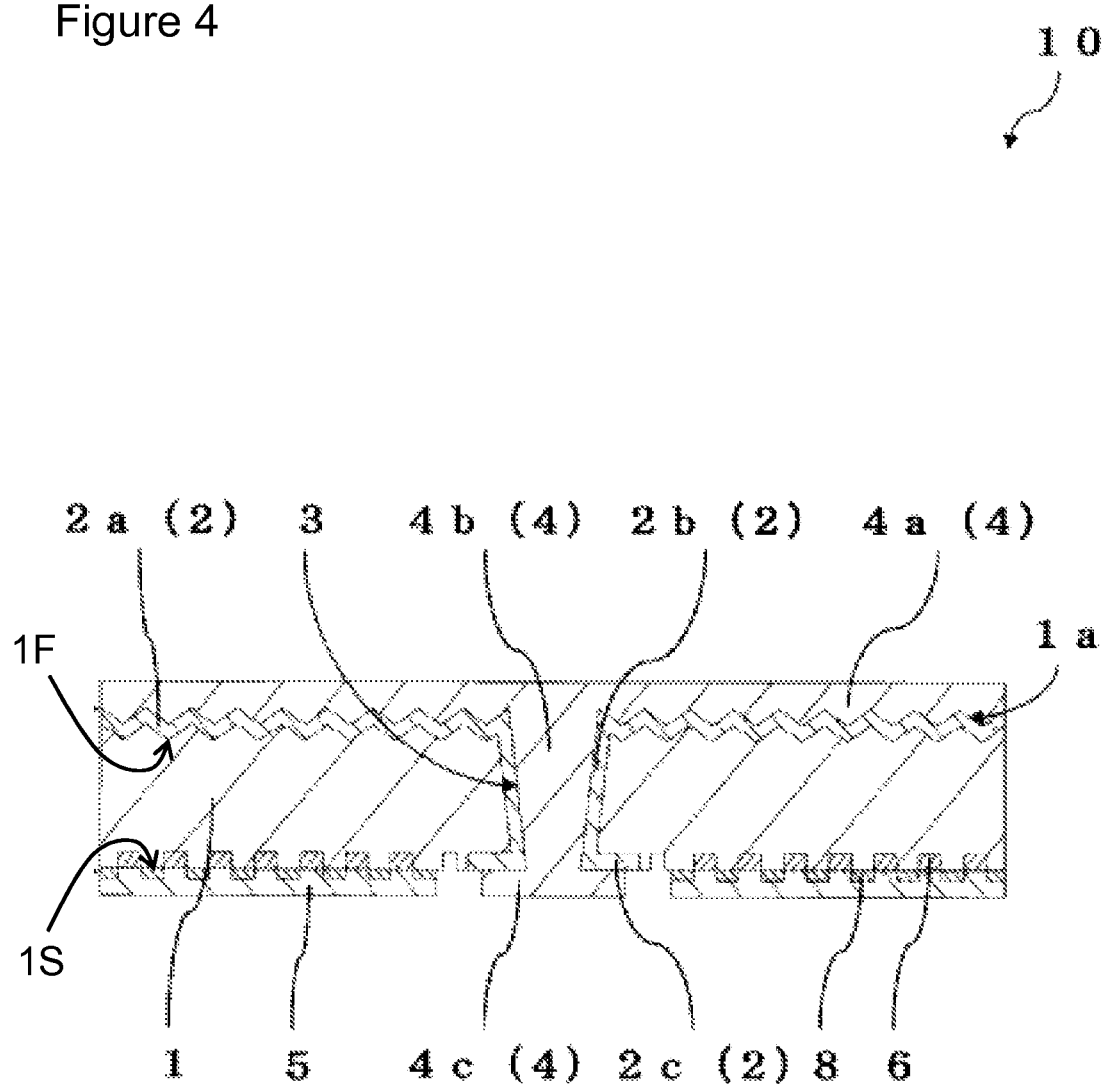
FIG. 4 is another exemplary cross-sectional view of section A-A in FIG. 1.

For example, as indicated at FIG. 4, passivation film 8 may be provided at the second surface 1S side of semiconductor substrate 1. Passivation film 8 has the role of reducing recombination of carriers at the back side (second surface 1S) of semiconductor substrate 1. As passivation film 8, silicon nitride ($Si_3N_4$), amorphous silicon nitride film (a-SiNx), or other such silicon-type nitride film, or silicon oxide ($SiO_2$), aluminum oxide ($Al_2O_3$), titanium oxide ($TiO_2$), or the like may be employed. Passivation film 8 may be formed so as to be on the order of 100 Angstroms to 2000 Angstroms in thickness. Second electrode 5 is formed over passivation film 8, contacts for making connection between semiconductor substrate 1 and second electrode 5 being formed at openings in passivation film 8. It will be advantageous if semiconductor layer 6 is formed at the semiconductor-substrate 1 side of these contacts. Passivation film 8 may be formed from film which contains hydrogen, as diffusion of hydrogen from the film into semiconductor substrate 1 will permit inactivation of grain boundaries and defects.

It is preferred in the present embodiment that the passivation film be formed so as to extend to the side face of the semiconductor substrate.

As a result, if passivation film 8 is also formed at the side face of semiconductor substrate 1, this will act as film to inhibit formation of plating thereat and will make it possible to reduce formation of plating where it is unwanted.

When passivation film 8 is formed at second surface 1S prior to formation of second electrode 5 and first output extracting portion 4c, it is preferred, for example, that sandblasting or mechanical scribing, or a laser or the like, be used to remove passivation film 8 at point-like regions at intervals of 200 μm (micrometers) to 1 mm on second electrode 5 before formation of contacts for making connection between semiconductor substrate 1 and second electrode 5.

A mask or the like may be used to form passivation film 8 so that it has prescribed features to permit formation of contacts.

At first output extracting portion 4c, passivation film 8 may be removed at least where present in regions surrounding conduction portion 4b.

Whereas passivation film 8 was formed in the present embodiment following formation of semiconductor layer 6, it is also possible to form semiconductor layer 6 following formation of passivation film 8. For example, aluminum paste which contains glass frit may be formed directly over passivation film 8, and the fire-through method, in which heat treatment is carried out at high temperature, may be used to form semiconductor layer 6 without removal of passivation film 8 in advance. Alternatively, printing, sputtering, vapor deposition, or the like may be employed to form an aluminum layer over passivation film 8, with local regions of the aluminum layer being irradiated with laser light to cause melting so that this aluminum component is made to penetrate passivation film 8 and is made to come in contact and react with semiconductor substrate 1 so as to permit formation of semiconductor layer 6 (the so-called laser fired (melted) contact (LFC) method). At such time, it is preferred that the semiconductor layer 6 which is formed be formed at point-like regions at intervals of 200 μm (micrometers) to 1 mm, and there is no need to remove the aluminum layer which is formed in accordance with the foregoing method. Second electrode 5 may be formed over passivation film 8 so as to permit connection to be made with the aluminum layer.

As shown in FIG. 1, a linear electrode portion which is electrically connected to conduction portions is provided on first surface 1F of solar cell element 10. It is preferred that the linear electrode portion have a first linear electrode portion that is directly connected to the conduction portions; and a second linear electrode portion that is disposed so as to be approximately parallel to the first linear electrode, and that is connected to the conduction portions by way of an auxiliary electrode portion which extends in one direction from the conduction portions.

Here, auxiliary electrode portion 4f extends in one direction from conduction portions 4b. Because second linear electrode portion 4e is not directly connected to conduction portion 4b, when semiconductor substrate 1 is viewed as projected onto a plane such that hidden surfaces are visible, there is no need to provide first output extracting portion 4c at locations on the second surface which correspond to regions at which second linear electrode portion 4e is provided. Provision of second linear electrode portion 4e at an end will ensure that there is a region of sufficient area for connection with wiring member 15 available where second electrode 5 is present at a location that is toward an end of first output extracting portion 4c in the direction of arrayal, and will make it possible to reduce delamination of wiring member 15.

It is preferred in the present embodiment that the long direction of auxiliary electrode portion 4f and the long direction of the array of conduction portions 4b be mutually parallel.

What is meant here by the "long direction" is indicated by a straight line that connects a conduction portion 4b with the mutually neighboring conduction portion 4b which is the shortest distance therefrom, this more or less matching the direction of arrayal BS.

That is, by making the long direction of auxiliary electrode portion 4f more or less match direction of arrayal BS, it is possible to reduce the area of the region at which auxiliary electrode portion 4f is formed, making it possible to lower resistive losses at auxiliary electrode portion 4f, and making it possible to lower the amount by which provision of auxiliary electrode portion 4f causes reduction in the amount of light that is collected.

Main electrode portion 4a of first electrode 4 has a first linear electrode portion 4d that permits direct connection to be made with conduction portions 4b belonging to mutually different columns on first surface 1F of semiconductor substrate 1.

Main electrode portion 4a also has, toward one end in direction of arrayal BS, a second linear electrode portion 4e, which does not make direct connection with conduction portion 4b. The long directions of first linear electrode portion 4d and second linear electrode portion 4e extend in approximately perpendicular fashion with respect to direction of arrayal BS.

First linear electrode portion 4d, second linear electrode portion 4e, and auxiliary electrode portion 4f of main electrode portion 4a are favorably formed so as to respectively have linewidths on the order of 50 μm (micrometers) to 100 μm (micrometers). From an esthetic standpoint, pluralities of such first linear electrode portions 4d and second linear electrode portions 4e may be formed so as to be approximately mutually parallel and spaced apart at regular intervals on the order, for example, of 1 mm to 3 mm therebetween.

As shown in FIG. 1, main electrode portion 4a may have circular contact pads 4g which are larger than the diameters of through-holes 3 and which are shaped so as to cover through-holes 3. In such an embodiment, it will still be possible to make connection with conduction portion 4b even if the location at which main electrode portion 4a is formed is slightly misaligned. The pattern used for main electrode portion(s) 4a is not limited to that shown at FIG. 1, it being possible to use a variety of patterns therefor.

As shown in FIG. 2, first electrode 4 has first output extracting portion 4c at location(s) on second surface 1S of semiconductor substrate 1 where connection is to be made with a plurality of conduction portions 4b (through-holes 3). This first output extracting portion 4c constitutes a long structure, the long direction of which is the direction of arrayal of conduction portions 4b. First output extracting portion 4c forms a plurality of columns (three columns in FIG. 2) in correspondence to the array of conduction portions 4b. Width of first output extracting portion 4c may be the same as or greater than the width of wiring member 15, described below. For example, a width of 1 mm to 4 mm, preferably 1.5 mm to 3 mm, may be chosen for first output extracting portion 4c.

Figure 14:
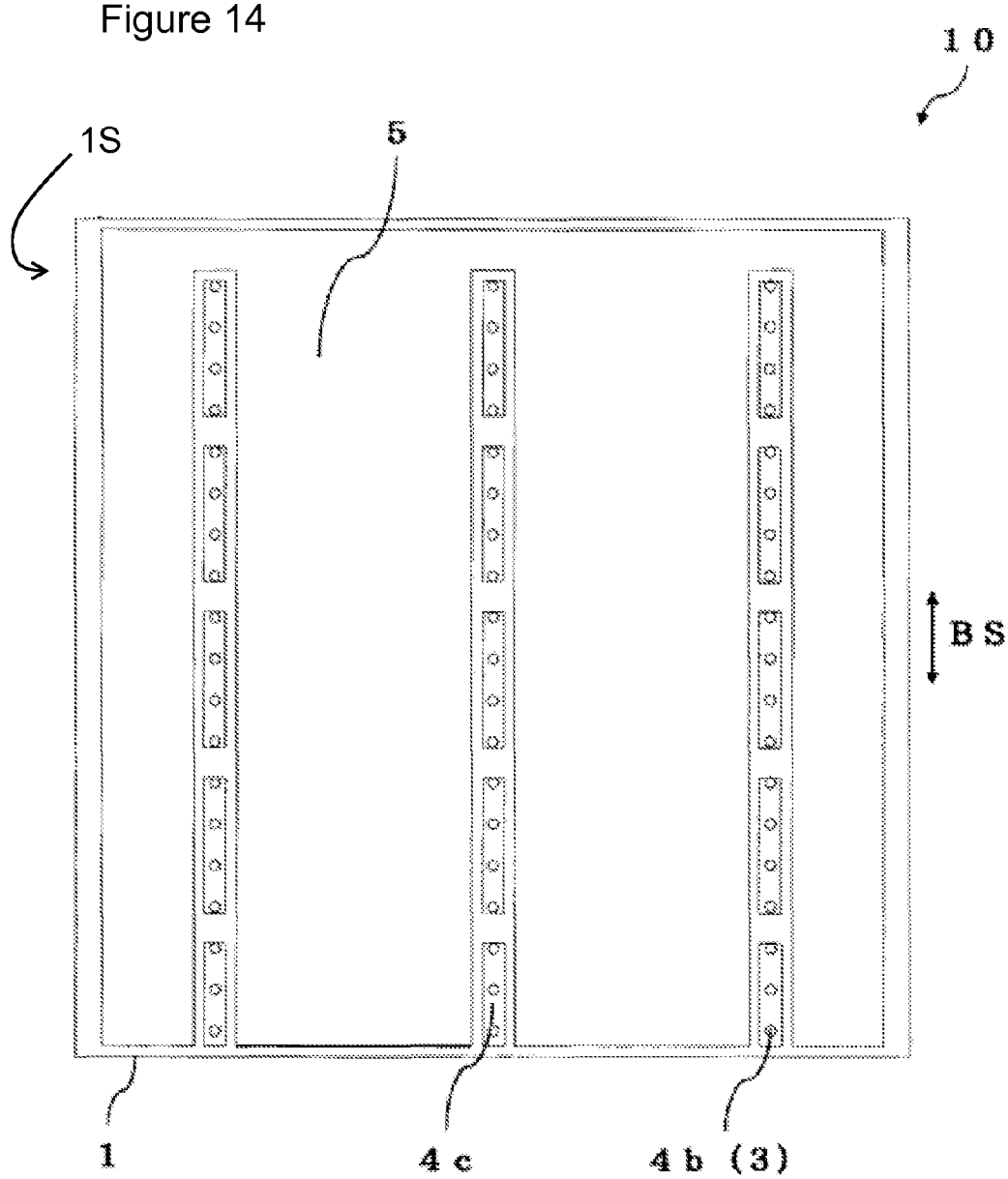
FIG. 14 is a plan view showing solar cell element according to another embodiment of the present invention as viewed from the second surface side thereof.
Figure 15:
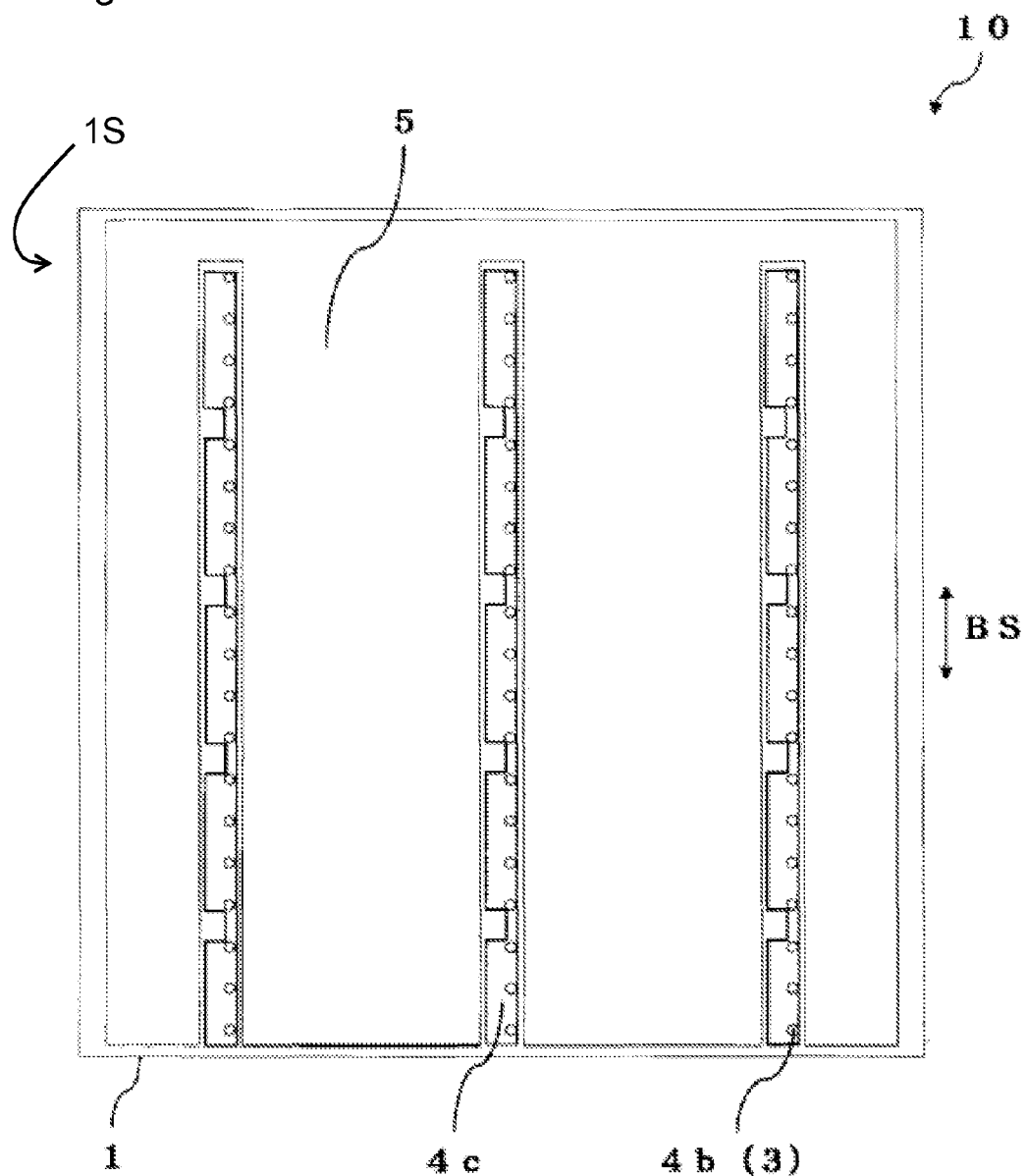
FIG. 15 is a plan view showing solar cell element according to another embodiment of the present invention as viewed from the second surface side thereof.

It is preferred that length of first output extracting portion 4c in direction of arrayal BS be chosen so as to be not less than 80% of length of solar cell element 10 in the direction of arrayal BS. First output extracting portion 4c formed in column-like fashion need not necessarily be a single unbroken whole as indicated at FIG. 2, it also being possible for this to be formed such that it is divided into multiple sections as indicated at FIG. 14. At this time, it is preferred that distance in direction of arrayal BS between ends of portions of first output extracting portion 4c at which connection is made constitute not less than 80% of length of solar cell element 10 in the direction of arrayal BS. It is also possible as indicated in FIG. 15 to employ a construction in which first output extracting portion 4c has regions that project from conduction portion 4b in a direction perpendicular to direction of arrayal BS, connection being made between the projecting regions and wiring member 15, so that wiring member 15 and conduction portion 4b do not come in direct physical contact with each other.

Second electrode 5 is of different polarity from first electrode 4, and is arranged on second surface 1S of semiconductor substrate 1 in such fashion as to be insulated from first electrode 4. This is why, for example, second electrode 5 may be arranged on second surface 1S of semiconductor substrate 1 so as to be spaced apart from first electrode 4.

Second electrode 5 is formed nearly everywhere on the second surface 1S side of semiconductor substrate 1 where first electrode 4 is not provided (uninterrupted region(s)), and collects current in the form of carriers produced at the second surface 1S side. What is meant here by "nearly everywhere" is that, when second surface 1S of semiconductor substrate 1 is viewed as projected onto a plane, second electrode 5 is formed at not less than 80% of the total region corresponding to second surface 1S. Considering the region at which first output extracting portion(s) 4c is/are formed, it is preferred that second electrode 5 be formed at not more than 95% of the total region corresponding to second surface 1S. In particular, if second electrode 5 is present at not less than 89% of the total region corresponding to second surface 1S, this will make it possible to reduce the degree of warping of the solar cell element, while also making it possible to reduce resistive losses at second electrode 5.

Solar Cell Element Manufacturing Method

Methods for manufacturing solar cell elements will now be described.

Semiconductor Substrate Preparation Operation

Semiconductor substrate 1 having p-type charge carriers is first prepared.

When monocrystalline silicon substrate is used as semiconductor substrate 1, a monocrystalline silicon ingot made in accordance with the floating zone (FZ) method, the Czochralski (CZ) method, or other such publicly known appropriate method may be sliced to prescribed thickness to obtain semiconductor substrate 1. When polycrystalline silicon substrate is used as semiconductor substrate 1, a polycrystalline silicon ingot made in accordance with the casting method, the in-the-mold aggregation method, or other such publicly known appropriate method may be sliced to prescribed thickness to obtain semiconductor substrate 1.

Below, description is given in terms of an example in which p-type polycrystalline silicon substrate that has been doped with boron (B) or gallium (Ga) as dopant element to obtain a concentration thereof on the order of $1\times10^{15}$ to $1\times10^{17}$ atoms/$cm^3$ is used as semiconductor substrate 1.

To remove mechanically damaged layers and/or contaminated layers produced at surface layer regions of semiconductor substrate 1 in accompaniment to slicing (cutting), NaOH or KOH, a mixture of hydrofluoric acid and nitric acid, or the like is used to etch on the order of 10 μm (micrometers) to 20 μm (micrometers) from surface layer regions at the front side (1F) and back side (1S) of the sliced semiconductor substrate 1, following which rinsing is carried out using pure water or the like to remove organic components and/or metal components.

Through-Hole Formation Operation

Next, through-holes 3 between first surface 1F and second surface 1S of semiconductor substrate 1 are formed.

Through-holes 3 are formed using a mechanical drill, water jet, laser machining device, or the like. To avoid causing damage to first surface 1F, which is the light-receiving surface, through-holes 3 are formed in such fashion that the machining or other such operation is directed from the second surface 1S side toward the first surface 1F side of semiconductor substrate 1. However, if the machining or other such operation is such that it causes little damage to semiconductor substrate 1, the machining or other such operation may be carried out in such fashion that it is directed from the first surface 1F side toward the second surface 1S side.

Textured Structure Formation Operation

Next, textured structure 1a (see FIGS. 3 and 4), which has fine projections (convexities) that are effective in reducing reflectance of light, is formed on the light-receiving side of the semiconductor substrate 1 in which through-holes 3 have been formed.

As method for forming textured structure 1a, wet etching using NaOH, KOH, or other such alkaline aqueous solution, or dry etching using a gas etchant having properties suitable for etching of the silicon material that makes up semiconductor substrate 1, may be employed.

Other-Charge-Carrier-Type Layer Formation Operation

Next, other-charge-carrier-type layer 2 is formed. That is, first other-charge-carrier-type layer 2a is formed at first surface 1F of semiconductor substrate 1, second other-charge-carrier-type layer 2b is formed at the internal surfaces of through-holes 3, and third other-charge-carrier-type layer 2c is formed at second surface 1S.

When p-type polycrystalline silicon substrate is used as semiconductor substrate 1, it is preferred that P (phosphorous) be used as n-type doping element for forming other-charge-carrier-type layer 2.

Other-charge-carrier-type layer 2 is formed using the coated thermal diffusion method in which $P_2O_5$ in paste form is applied to target locations on semiconductor substrate 1 and is thermally diffused thereinto, gas-phase thermal diffusion in which $POCl_3$ (phosphorus oxychloride) in gas form is used as diffusion source and is diffused into target locations, ion implantation in which ions are directly irradiated and implanted into intended target locations, or the like. It is preferred that gas-phase thermal diffusion be employed, since this will allow other-charge-carrier-type layer 2 to simultaneously be formed at internal surfaces of through-holes 3 and at target locations at both principal planes of semiconductor substrate 1.

Under conditions where diffusion is also occur at regions other than target locations, diffusion into such regions can be prevented by forming a diffusion barrier layer in advance at such regions before forming other-charge-carrier-type layer 2. Instead of forming a diffusion barrier layer, it is also possible for regions other than target locations at which diffusion occurs to be removed afterward by etching. For example, where this is the case, a resist film may be formed over second other-charge-carrier-type layer 2b and/or third other-charge-carrier-type layer 2c, and wet etching or dry etching may be carried out to remove unwanted diffusion regions at the second surface 1S side.

Laser irradiation or other appropriate method may be used to carry out pn isolation at locations peripheral to regions where first electrode 4 is formed and/or at locations along the perimeter of second surface 1S of semiconductor substrate 1.

Semiconductor Layer Formation Operation

Next, semiconductor layer 6 is formed at second surface 1S of semiconductor substrate 1.

When boron is used as dopant element, semiconductor layer 6 is formed by carrying out thermal diffusion at on the order of 800° C. to 1100° C. using $BBr_3$ (boron tribromide) as diffusion source. In such case, before forming semiconductor layer 6, it is desirable that a diffusion barrier layer comprising oxide film or the like be formed over regions other than where it is intended that semiconductor layer 6 be formed, e.g., over other-charge-carrier-type layer 2 or other such features that have already been formed, and that this diffusion barrier layer be removed following formation of semiconductor layer 6. Where a resist film has been provided for removal of diffusion regions, this may be left in place and used as diffusion barrier layer.

When aluminum is used as dopant element, semiconductor layer 6 may be formed by using printing to apply aluminum paste comprising powdered aluminum, organic vehicle, and so forth to second surface 1S of semiconductor substrate 1, and thereafter carrying out heat treatment (firing) at on the order of 700° C. to 850° C. to cause diffusion of aluminum into semiconductor substrate 1. In such case, it will be possible to form a semiconductor layer 6 which is such that desired diffusion regions are present only at second surface 1S, which is the surface on which the aluminum paste is printed. Following firing, the layer comprising aluminum which was formed over second surface 1S would then be removed therefrom.

Antireflective Film Formation Operation

Next, antireflective film 7 is formed over first other-charge-carrier-type layer 2a.

As method for forming antireflective film 7, plasma-enhanced chemical vapor deposition (PECVD), vapor deposition, sputtering, or the like may be employed. For example, when PECVD is used to form antireflective film 7 comprising SiNx film, the interior of a reaction chamber may be heated to on the order of 500° C., a gas mixture of silane ($Si_3H_4$) and ammonia ($NH_3$) may be diluted with nitrogen, and glow discharge decomposition may be employed to generate a plasma that is used to carry out deposition for formation of antireflective film 7. Antireflective film 7 may also be formed over second other-charge-carrier-type layer 2b.

Passivation Film Formation Operation

Next, passivation film 8 may be formed at second surface 1S of semiconductor substrate 1.

As method for forming passivation film 8, PECVD, vapor deposition, sputtering, or the like may be employed. A mask may be provided over regions other than where it is intended that passivation film 8 be formed, or passivation film 8 may be formed over the entire second surface 1S and thereafter be removed therefrom at regions other than where it was intended to be formed.

Electrode Formation Method

Next, main electrode portion 4a and conduction portion 4b which make up first electrode 4 are formed.

Main electrode portion 4a and conduction portion 4b may, for example, be formed by coating. More specifically, electrically conductive paste obtained, for example, by adding 10 to 30 parts by weight of organic vehicle and 0.1 to 10 parts by weight of glass frit to 100 parts by weight of metal power comprising silver or the like may be applied over first surface 1F of semiconductor substrate 1 to form a film coating thereon in a pattern that will cause formation of main electrode portions 4a as indicated in FIG. 1, and said film coating may thereafter be fired for on the order of several tens of seconds to several tens of minutes at a maximum temperature of 500° C. to 850° C. to form main electrode portions 4a and conduction portions 4b. In such case, if during application of electrically conductive paste, said electrically conductive paste is also allowed to fill through-holes 3, this will make it possible to also form conduction portions 4b. Following application of electrically conductive paste and before firing, it is preferred that solvent within the film coating be evaporated at prescribed temperature and that drying of said film coating be carried out. It is also possible to carry out formation such that coating/firing is carried out separately for main electrode portions 4a and for conduction portions 4b, in which case filling/drying of electrically conductive paste may be carried out in advance at through-holes 3 only, firing being carried out thereafter after first applying electrically conductive paste in accordance with the pattern of main electrode portions 4a which is indicated in FIG. 1 in the same manner as described above, and so forth.

When antireflective film 7 is formed prior to formation of main electrode portion 4a, main electrode portions 4a may be formed in patterned regions, or main electrode portions 4a may be formed by the fire-through method.

On the other hand, there is no objection to forming antireflective film 7 after formation of main electrode portions 4a. In such case, because there will be no need to carry out patterning of antireflective film 7, and because there will be no need to use the fire-through method, conditions for forming main electrode portions 4a will be more relaxed. When such an operation is employed, it will, for example, be possible to form main electrode portions 4a without carrying out firing at high temperatures on the order of 800° C.

First output extracting portions 4c and second electrode 5 are then formed on second surface 1S of semiconductor substrate 1.

First output extracting portion 4c may be formed, for example, by applying electrically conductive paste made up of silver, copper, or the like and subjecting this to heating, or by carrying out sputtering or vapor deposition of silver, copper, or other such metal.

There is also no objection to use of electroless plating for formation of such plating layer(s) 52.

Solar Cell Module Manufacturing Method

Next, methods for using solar cell element(s) 10 as described above to manufacture a solar cell module 20 will be described.

First, wiring member 15 is prepared in advance from copper foil on the order of 0.1 mm to 0.4 mm in thickness and on the order of 1 mm to 3 mm in width which has been coated over its entire surface with solder material and which is then cut to prescribed length in the long direction thereof.

As shown in FIG. 6, a plurality of solar cell elements 10 are placed such that respective second surfaces 1S thereof face upward and so as to be spaced apart with prescribed distance therebetween. Wiring member 15 is made to contact first output extracting portions 4c and second electrodes 5 of solar cell elements 10 from above. While in this state, hot air or a soldering iron is used, or a reflow oven is be used, to melt solder on the surface of wiring member 15 so as to cause wiring member 15 to be connected to first output extracting portions 4c and second electrodes 5. Such method will permit solar cell elements 10 to be interconnected with a high degree of manufacturability. Low-temperature-curing electrically conductive adhesive or solder paste which consists of electrically conductive filler made up of silver, nickel, carbon, or the like and in which epoxy-, silicone-, polyimide-, or polyurethane-type resin or the like serves as binder may be used to connect wiring member 15 thereto. Alternatively, electrically conductive adhesive or solder paste may be provided at first output extracting portions 4c and second electrode 5, wiring member 15 may be brought into contact therewith from above, and this may thereafter be subjected to heat treatment at on the order of 150° C. to 250° C., to connect wiring member 15 to first output extracting portions 4c of one solar cell element 10 and to second electrode 5 of another solar cell element 10.

The module base obtained by sequentially stacking frontside filler material 12, the plurality of solar cell elements 10 which have been interconnected by wiring member 15, backside filler material 13, and backside protective member 14 over translucent member 11 is thereafter placed in a laminator and is degassed and is heated and subjected to pressure so as to form an integral structure, as a result of which solar cell module 20 is obtained.

As indicated at FIG. 5 (b), a frame 16 made of aluminum or the like may, where necessary, be fitted along the periphery of the aforementioned solar cell module 20. As shown at FIG. 5 (a), the electrodes of the solar cell elements which are the first solar cell element 10 and the last solar cell element 10 among the plurality of solar cell elements 10 that are connected in series, are connected at one end thereof by output extracting leads 18 to terminal box 17 which serves as output extraction unit.

As a result of the foregoing procedure, solar cell module 20 associated with of the present embodiment may be obtained.

Variations

Methods for forming other-charge-carrier-type layer 2 and semiconductor layer 6 are not limited to those described above. For example, thin film formation technologies may be employed to form hydrogenated amorphous silicon films, crystalline silicon films including microcrystalline silicon films, and so forth.

Working Examples

Working examples which provide more specific details are described below.

First, as semiconductor substrates 1, polycrystalline silicon substrates 1 which were 156 cm on a side and which were 200 μm (micrometers) in thickness were prepared. Such polycrystalline silicon substrates 1 were previously doped with boron so as to have p-type charge carriers.

A YAG laser apparatus was used to form a plurality of through-holes 3 in respective polycrystalline silicon substrates 1 prepared as described above. RIE was employed to form textured structure 1a on the principal-plane side corresponding to the light-receiving surface (first surface 1F) thereof.

Next, phosphorous atoms were diffused thereinto to form n-type other-charge-carrier-type layer 2 (first other-charge-carrier-type layer 2a, other-charge-carrier-type layer 2b, and third other-charge-carrier-type layer 2c) having sheet resistance 90Ω/□ (ohm/square).

Plasma CVD was used to further form antireflective film 7 comprising silicon nitride on the light-receiving-surface side thereof pn isolation was carried out by using hydrofluoric acid solution to remove a portion of the other-charge-carrier-type layer that had been formed on the principal-plane side corresponding to the backside (second surface 1S) thereof.

Figure 8:
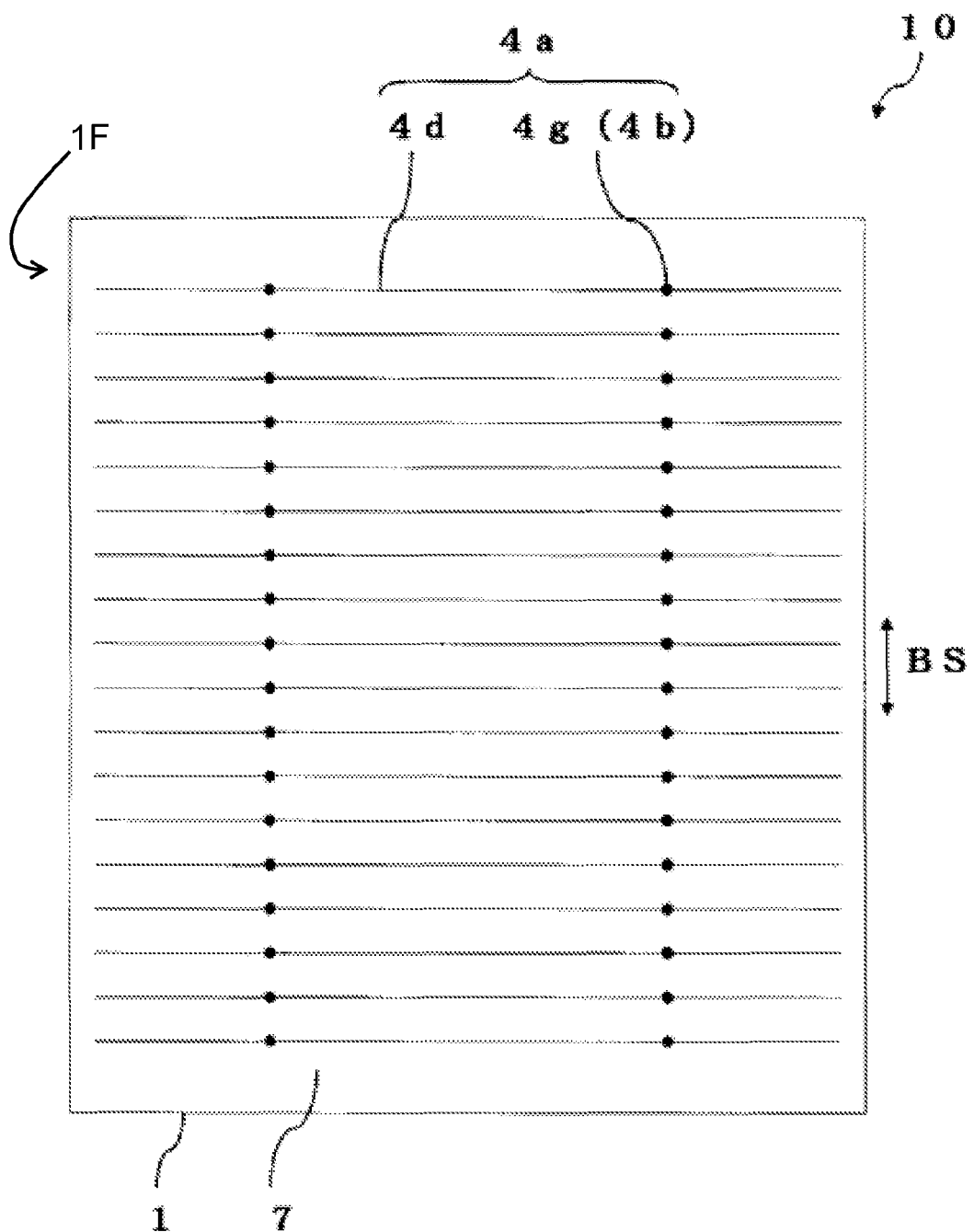
FIG. 8 is a plan view of solar cell element according to Comparative Example 1 as viewed from the first surface side thereof.
Figure 9:
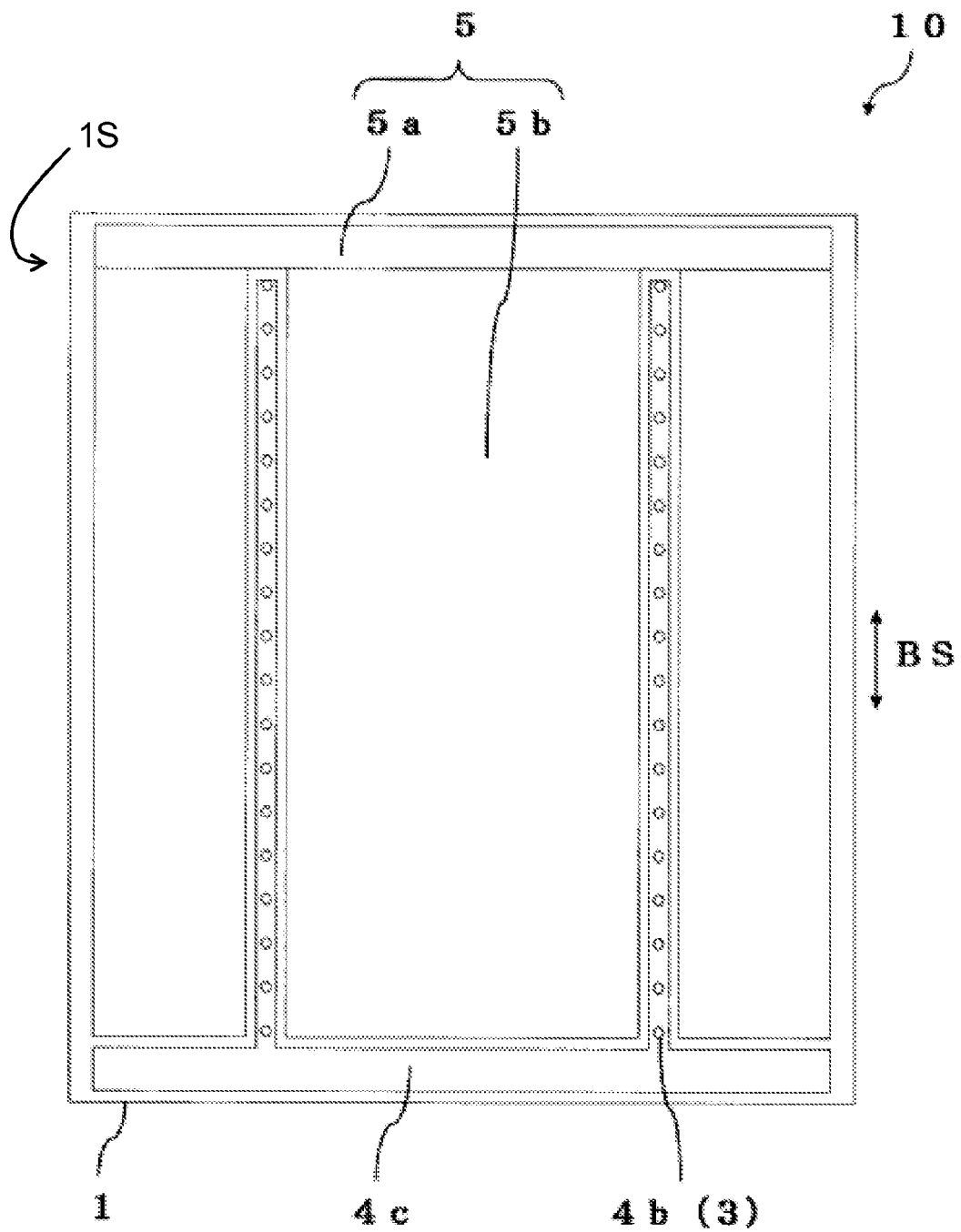
FIG. 9 is a plan view of solar cell element according to Comparative Example 1 as viewed from the second surface side thereof.
Figure 11:
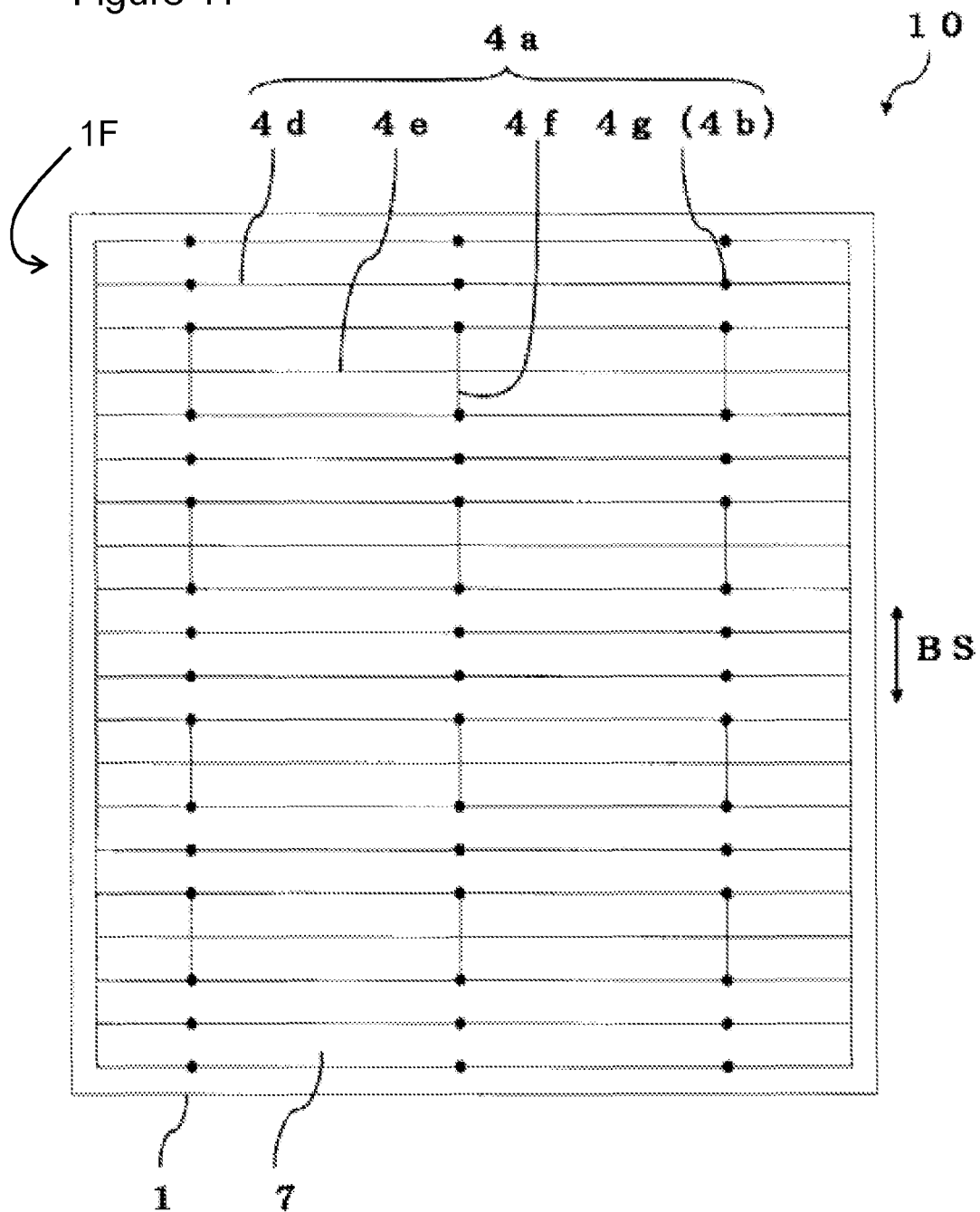
FIG. 11 is a plan view of solar cell element according to Comparative Example 2 as viewed from the first surface side thereof.
Figure 12:
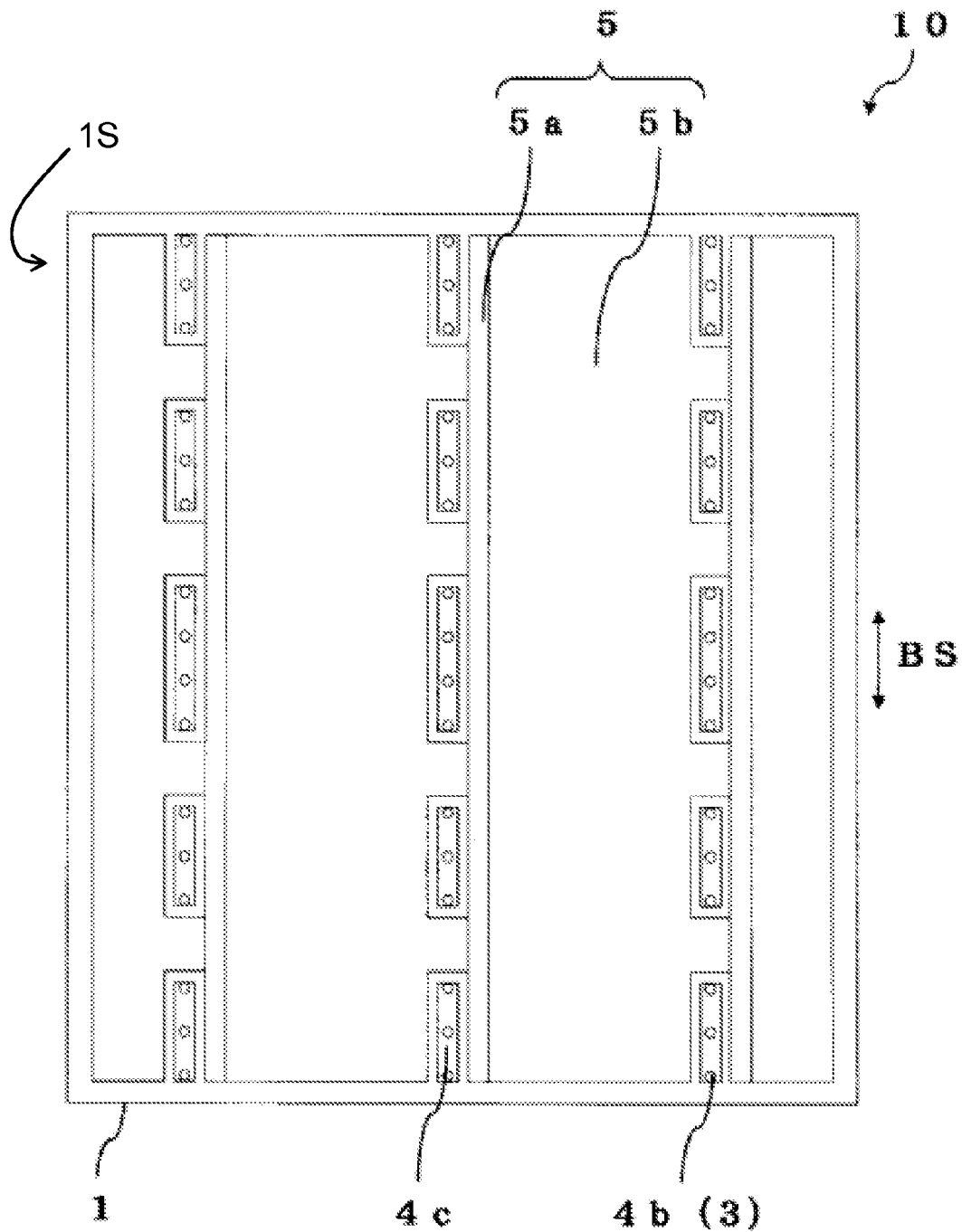
FIG. 12 is a plan view of solar cell element according to Comparative Example 2 as viewed from the second surface side thereof.

With respect to the electrode structure employed at first surface 1F and second surface 1S, three types of solar cell element were formed, the configuration shown in FIGS. 1 and 2 being employed at Working Example 1, the configuration shown in FIGS. 8 and 9 being employed at Comparative Example 1, and the configuration shown in FIGS. 11 and 12 being employed at Comparative Example 2.

At Working Example 1, each sample and specimen for measurement of resistivity was such that the first electrode 4 thereof was formed by coating with silver paste and firing; and the second electrode 5 thereof was formed by coating with aluminum paste and firing to form an aluminum layer, over which sputtering was employed to form a layer made up of an alloy of titanium and tungsten, over which electrolytic plating was employed to form a plating layer 52 comprising copper, over which electrolytic plating was employed to form a plating layer 52 comprising tin.

At Comparative Examples 1 and 2, each sample and specimen for measurement of resistivity was such that the first electrode 4 thereof and the second output extracting portion 5a of the second electrode 5 thereof were formed by coating with silver paste and firing; and the collector portion 5b of the second electrode was formed by coating with aluminum paste and firing.

Here, the specimens for measurement of resistivity were 10 mm×10 mm×0.3 mm in thickness, the four-probe method being employed using these to measure resistivity of the outermost portion of second electrode 5, with this resistivity value being adjusted separately for each sample. This was $2.0\times10^{-8}$ Ωm (ohm-meter) to $2.5\times10^{-8}$ Ωm (ohm-meter) at Working Example 1, and was $4.0\times10^{-7}$ Ωm (ohm-meter) to $5\times10^{-7}$ Ωm (ohm-meter) at Comparative Examples 1 and 2.

Figure 10:
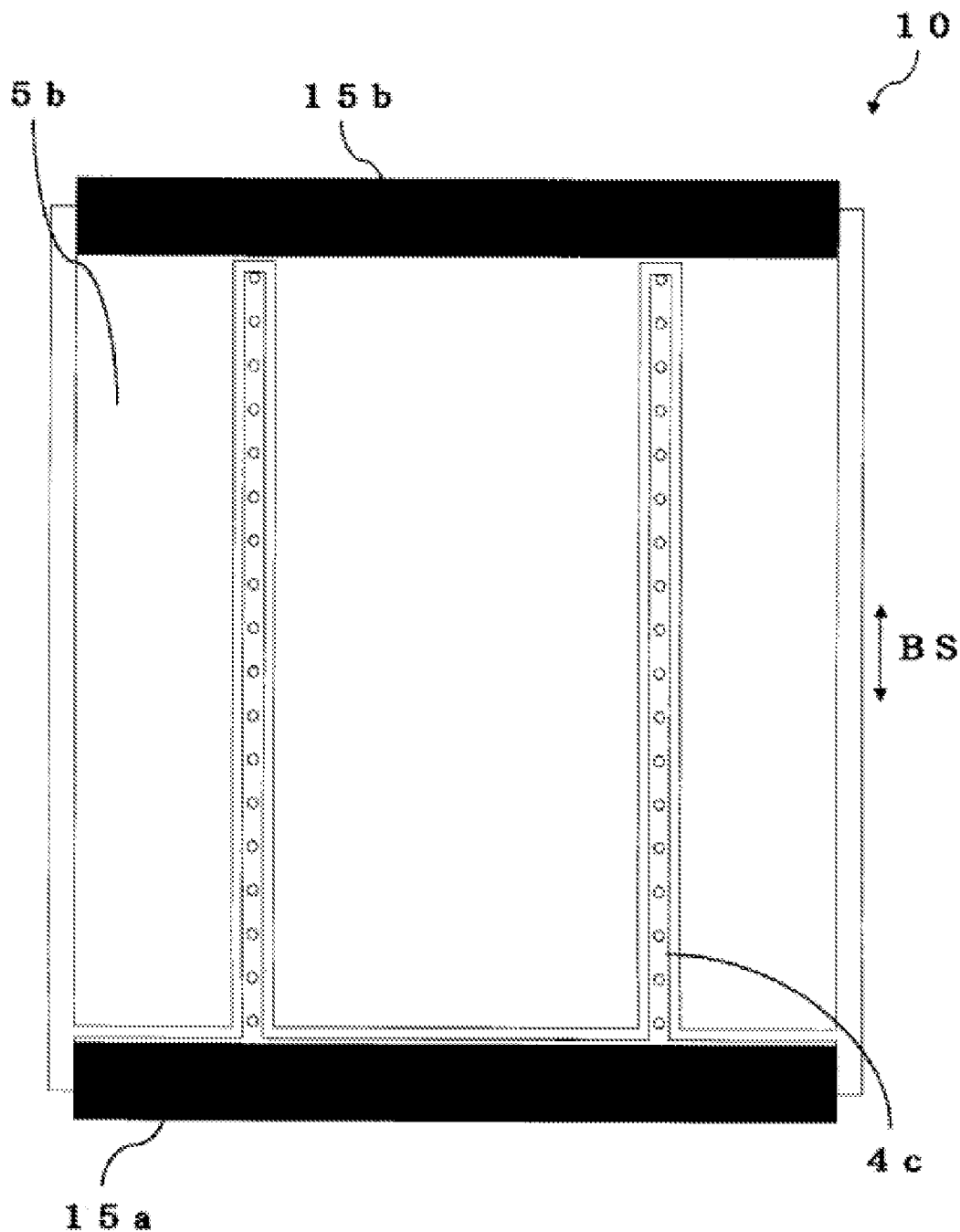
FIG. 10 is a plan view of solar cell element with wiring according to Comparative Example 1 as viewed from the second surface side thereof.
Figure 13:
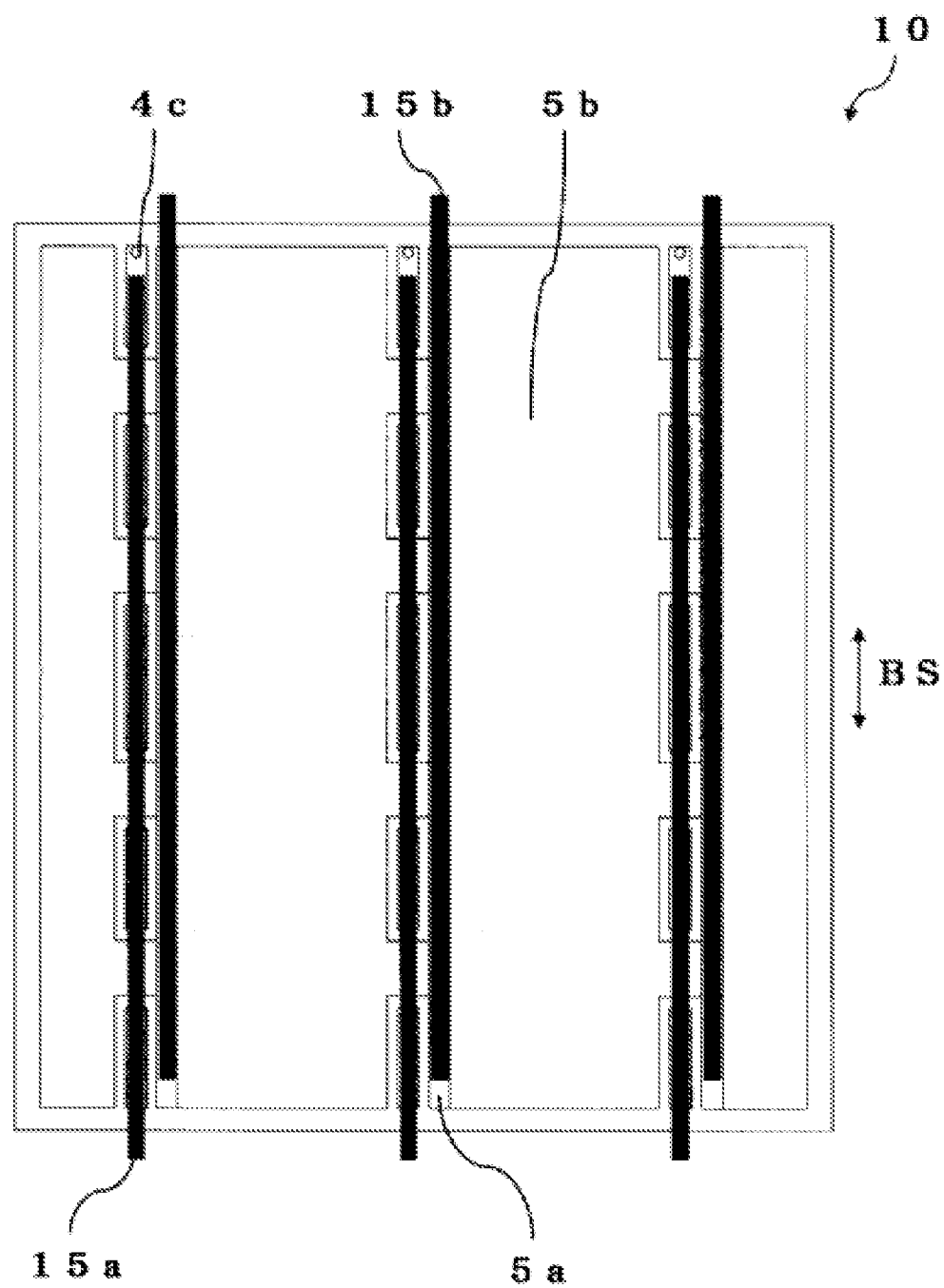
FIG. 13 is a plan view of solar cell element with wiring according to Comparative Example 2 as viewed from the second surface side thereof and showing how connection is made by means of wiring member(s).

As shown in FIG. 7, FIG. 10, and FIG. 13, wiring member 15, which was copper foil that had been coated over its entire surface with solder material, was soldered to first output extracting portions 4c of first electrode 4 and to second electrode 5 (second output extracting portion 5a).

Ten solar cell elements, alike in all other respects, were respectively manufactured for each working/comparative example, and solar cell element output characteristics thereof and the degree of warping thereat were evaluated. Here, the value used to evaluate the degree of warping included the thickness of semiconductor substrate 1, the degree of warping being evaluated by placing the solar cell element on a horizontal surface and measuring the difference in height between the lowest location (i.e., the horizontal surface) and the highest location.

TABLE 1 shows output characteristics and degree of warping for each working/comparative example. All values shown indicate the average over ten solar cell elements.

TABLE 1

|  | Conversion Efficiency (%) | Warping (mm) |
| --- | --- | --- |
| Working Example 1 | 17.5 | 3.1 |
| Comparative Example 1 | 16.8 | 2.5 |
| Comparative Example 2 | 17.4 | 4.8 |

As compared with Comparative Example 1, Working Example 1 permitted the copper foil connected to first electrode 4 to be connected in such fashion that it extended in the direction of arrayal BS, permitted the path lengths taken by the current collected from the respective main electrode portions 4a to be shortened, and permitted improvement in output characteristics due to the lowered resistivity at second electrode 5. Although Comparative Example 1 exhibited a small degree of warping in the direction of arrayal BS, the degree of warping in a direction perpendicular to the direction of arrayal BS was larger.

As compared with Comparative Example 2, Working Example 1 permitted confirmation of the fact that the degree of warping at solar cell element 10 caused by wiring member 15 could be reduced while output characteristics of the solar cell module 20 were able to be maintained.

Next, the solar cell element of Working Example was used as basis for creation of samples in which width of first output extracting portion 4c was 2.3 mm, the number of first output extracting portion(s) 4c was varied from one to seven, the fractional area of second electrode 5 was varied between 87% and 96%. Solar cell element output characteristics and degree of warping were then evaluated for each sample. The results are presented at TABLE 2. The length in the direction of arrayal BS at the end of second electrode 5 connected to wiring member 15 was 3 mm.

TABLE 2

| Sample | Width of First Output Extracting Electrode (mm) | Number of First Output Extracting Electrodes (electrodes) | Fractional Area of Second Electrode (%) | Conversion Efficiency (%) | Warping (mm) |
| --- | --- | --- | --- | --- | --- |
| 1 | 2.3 | 1 | 96 | 15.2 | 1.2 |
| 2 | 2.3 | 2 | 95 | 17.1 | 2.1 |
| 3 | 2.3 | 3 | 93 | 17.5 | 3.1 |
| 4 | 2.3 | 4 | 92 | 17.7 | 3.7 |
| 5 | 2.3 | 5 | 90 | 17.8 | 4.4 |
| 6 | 2.3 | 6 | 89 | 17.8 | 4.8 |
| 7 | 2.3 | 7 | 87 | 17.8 | 5.5 |

Here, Sample 3 corresponds to Working Example 1. From the results for Samples 2 through 6, these samples corresponding to working examples of the present invention, it was possible to confirm that when fractional area of second electrode 5 was 89% to 95%, degree of warping was not more than 4.8 mm and conversion efficiency was not less than 17%.

EXPLANATION OF REFERENCE NUMERALS

1 Semiconductor substrate
2 Other-charge-carrier-type layer
   2a First other-charge-carrier-type layer
   2b Second other-charge-carrier-type layer
   2c Third other-charge-carrier-type layer
3 Through-hole
4 First electrode
   4a Main electrode portion
   4b Conduction portion
   4c First output extracting portion
   4d First linear electrode portion
   4e Second linear electrode portion
   4f Auxiliary electrode portion
   4g Contact pad
5 Second electrode
   5a Second output extracting portion
   5b Collector portion
6 Semiconductor layer
7 Antireflective film
8 Passivation film
10 Solar cell element
11 Translucent substrate
12 Frontside filler material
13 Backside filler material
14 Backside protective member
15 Wiring member
16 Frame
17 Terminal box
18 Output extracting lead
20 Solar cell module
51 Underlayer
52 Plating layer

The invention claimed is:

1. A solar cell element comprising:
a semiconductor substrate comprising:
   a first surface;
   a second surface at a back side of the first surface; and
   a plurality of through-holes forming a line, and penetrating from the first surface to the second surface;
a first electrode comprising:
   a plurality of conduction portions respectively located in the plurality of through-holes; and
   at least one first output extracting portion on the second surface, electrically connected to the conduction portions;
a second electrode on the second surface, spaced apart from the first output extracting portion;
a first wiring member, having an elongated shape, and extending not less than 80% of the length of the solar cell element, and connected to the first output extracting portion; and
a second wiring member connected to the second electrode, wherein the first wiring member and the second wiring member form a straight line.

2. The solar cell element according to claim 1, wherein the second electrode further comprises a plating layer that comprises tin or silver, and that has a thickness of 5 μm (micrometers) to 30 μm (micrometers).

3. The solar cell element according to claim 2, wherein the second electrode further comprises an underlayer beneath the plating layer, comprising a titanium-tungsten-type alloy as a main component thereof.

4. The solar cell element according to claim 3, wherein the underlayer has a thickness of 50 nm to 500 nm.

5. The solar cell element according to claim 1, wherein the second electrode occupies 89% to 95% of an area of the second surface.

6. The solar cell element according to claim 1, wherein the first electrode comprises four or more first output extracting portions, each first output extracting portion lying on either one of two parallel straight lines, and the second electrode is located between the two lines and has a length of 10 mm to 50 mm in a direction perpendicular to the lines.

7. The solar cell element according to claim 1, further comprising:
a passivation film present between the second electrode and the semiconductor substrate.

8. The solar cell element according to claim 7, wherein the passivation film extends to a bottom face of the semiconductor substrate.

9. The solar cell element according to claim 1, further comprising:
an auxiliary electrode extending in one direction from the conduction portions; and
a linear electrode portion on the first surface, electrically connected to the conduction portions,
the linear electrode portion comprising:
   a first linear electrode portion directly connected to the conduction portions; and
   a second linear electrode portion being approximately parallel to the first linear electrode portion, and connected to the conduction portions by way of the auxiliary electrode.

10. The solar cell element according to claim 9, wherein a long direction of the auxiliary electrode portion and a long direction of the array of conduction portions are mutually parallel.

11. A solar cell module comprising the solar cell element according to claim 1.

12. A solar module comprising:
a first solar cell element comprising:
a first semiconductor substrate comprising:
first surface and second surfaces opposite to each other; and
a plurality of first through-holes, each penetrating the first semiconductor substrate from the first surface to the second surface;
a first electrode comprising:
a plurality of first conduction portions respectively located in the plurality of first through-holes; and
at least one first output extracting portion on the second surface, electrically connected to the first conduction portions;
a second electrode on the second surface, spaced apart from the first output extracting portion;
a second solar cell element comprising:
a second semiconductor substrate comprising:
third surface and fourth surfaces opposite to each other; and
a plurality of second through-holes each penetrating the second semiconductor substrate from the third surface to the fourth surface;
a third electrode comprising:
a plurality of second conduction portions respectively located in the plurality of second through-holes; and
at least one second output extracting portion on the fourth surface, electrically connected to the second conduction portions;
a fourth electrode on the fourth surface, spaced apart from the second output extracting portion;
a first wiring member having an elongated shape, comprising a first end and a second end, wherein the first end is connected to an external circuit, and the second end is connected to the second electrode;
a second wiring member having an elongated shape, comprising a third end and a fourth end, wherein the third end is connected to the first electrode, and the fourth end is connected to the fourth electrode;
a third wiring member having an elongated shape, comprising a fifth end and a sixth end, wherein the fifth end is connected to the third electrode, wherein
all the first through-holes connected to the second wiring member make a first straight line,
all the second through-holes connected to the third wiring member make a second straight line,
the second wiring member and the third wiring member form a third straight line, and
the first, second and third straight lines overlap to each other.

13. The solar cell module according to claim 12, further comprising:
a third solar cell element comprising:
a third semiconductor substrate comprising:
fifth surface and sixth surfaces opposite to each other; and
a plurality of third through-holes each penetrating the third semiconductor substrate from the fifth surface to the sixth surface;
a fifth electrode comprising:
a plurality of third conduction portions respectively located in the plurality of third through-holes; and
at least one third output extracting portion on the sixth surface, electrically connected to the third conduction portions;
a sixth electrode on the sixth surface, spaced apart from the third output extracting portion;
a fourth wiring member having an elongated shape, comprising a seventh end and a eighth end, wherein the sixth end is connected to the sixth electrode, the seventh end is connected to the fifth electrode, and the eighth end is connected to a second external circuit, wherein
all the third through-holes connected to the fourth wiring member are on a first extended straight line that is extended from the first strait line,
the fourth wiring member is on a second extended straight line that is extended from the third straight line, and
the first and second extended lines overlap to each other.

14. The solar cell module according to claim 11, wherein a ratio of a part of the second wiring member overlapping the first semiconductor substrate to a length of the first semiconductor substrate in a direction of the first ling is 0.8 or higher.

15. The solar cell module according to claim 12, wherein
the first semiconductor substrate further comprises a plurality of third through-holes, each penetrating the first semiconductor substrate from the first surface to the second surface,
the second semiconductor substrate further comprises a plurality of fourth through-holes, each penetrating the second semiconductor substrate from the third surface to the fourth surface;
the first solar cell element further comprises:
a fifth electrode comprising:
a plurality of third conduction portions respectively located in the plurality of third through-holes; and
at least one third output extracting portion on the second surface, electrically connected to the third conduction portions, wherein the fifth electrode is spaced apart from the at least one first output extracting portion,
the second solar cell element further comprises:
a sixth electrode comprising:
a plurality of fourth conduction portions respectively located in the plurality of fourth through-holes; and
at least one fourth output extracting portion on the fourth surface, electrically connected to the fourth conduction portions, wherein the sixth electrode is spaced apart from the second output extracting portion, and
a fourth wiring member having an elongated shape, comprising a seventh end and a eighth end, wherein the seventh end is connected to the fifth electrode, and the eighth end is connected to the fourth electrode,
all the third trough-holes comprising the third conduction portions that are connected to the fourth wiring member form a fourth straight line, and
the fourth straight line is parallel to the first straight line.

* * * * *